(12) United States Patent
Ernst et al.

(10) Patent No.: US 9,606,209 B2
(45) Date of Patent: Mar. 28, 2017

(54) METHODS, SYSTEMS, AND DEVICES FOR INTRA-SCAN MOTION CORRECTION

(75) Inventors: Thomas Michael Ernst, Honolulu, HI (US); Oliver Speck, Magdeburg (DE)

(73) Assignee: KINETICOR, INC., Honolulu, HI (US)

( * ) Notice: Subject to any disclaimer, the term of this patent is extended or adjusted under 35 U.S.C. 154(b) by 1078 days.

(21) Appl. No.: 13/594,563

(22) Filed: Aug. 24, 2012

(65) Prior Publication Data

US 2013/0049756 A1    Feb. 28, 2013

Related U.S. Application Data

(60) Provisional application No. 61/527,972, filed on Aug. 26, 2011.

(51) Int. Cl.
*G01R 33/32* (2006.01)
*G01R 33/565* (2006.01)

(52) U.S. Cl.
CPC .............. *G01R 33/56509* (2013.01)

(58) Field of Classification Search
CPC ................................. G01R 33/56509
USPC ................................. 324/300–322
See application file for complete search history.

(56) References Cited

U.S. PATENT DOCUMENTS

| | | |
|---|---|---|
| 4,724,386 A | 2/1988 | Haacke et al. |
| 4,894,129 A | 1/1990 | Leiponen et al. |
| 4,953,554 A | 9/1990 | Zerhouni et al. |
| 5,318,026 A | 6/1994 | Pelc |
| 5,545,993 A | 8/1996 | Taguchi et al. |
| 5,615,677 A | 4/1997 | Pelc et al. |
| 5,687,725 A | 11/1997 | Wendt |
| 5,886,257 A | 3/1999 | Gustafson et al. |
| 5,889,505 A | 3/1999 | Toyama |
| 5,936,722 A | 8/1999 | Armstrong et al. |
| 5,936,723 A | 8/1999 | Schmidt et al. |
| 5,947,900 A | 9/1999 | Derbyshire et al. |
| 5,987,349 A | 11/1999 | Schulz |
| 6,031,888 A | 2/2000 | Ivan et al. |

(Continued)

FOREIGN PATENT DOCUMENTS

| | | |
|---|---|---|
| EP | 1524626 | 4/2005 |
| EP | 2515139 | 10/2012 |

(Continued)

OTHER PUBLICATIONS

Gumus et al., "Elimination of DWI signal dropouts using blipped gradients for dynamic restoration of gradient moment", ISMRM 20th Annual Meeting & Exhibition, May 7, 2012.

(Continued)

*Primary Examiner* — Melissa Koval
*Assistant Examiner* — Rishi Patel
(74) *Attorney, Agent, or Firm* — Knobbe, Martens, Olson & Bear, LLP

(57) ABSTRACT

Systems, methods, and devices for intra-scan motion correction to compensate not only from one line or acquisition step to the next, but also within each acquisition step or line in k-space. The systems, methods, and devices for intra-scan motion correction can comprise updating geometry parameters, phase, read, and/or other encoding gradients, applying a correction gradient block, and/or correcting residual errors in orientation, pose, and/or gradient/phase.

21 Claims, 12 Drawing Sheets

(56) References Cited

U.S. PATENT DOCUMENTS

| | | |
|---|---|---|
| 6,044,308 A | 3/2000 | Huissoon |
| 6,057,680 A | 5/2000 | Foo et al. |
| 6,061,644 A | 5/2000 | Leis |
| 6,088,482 A | 7/2000 | He |
| 6,144,875 A | 11/2000 | Schweikard et al. |
| 6,236,737 B1 | 5/2001 | Gregson et al. |
| 6,246,900 B1 | 6/2001 | Cosman et al. |
| 6,279,579 B1 | 8/2001 | Riaziat et al. |
| 6,285,902 B1 | 9/2001 | Kienzle, III et al. |
| 6,292,683 B1 | 9/2001 | Gupta et al. |
| 6,298,262 B1 | 10/2001 | Franck et al. |
| 6,381,485 B1 | 4/2002 | Hunter et al. |
| 6,384,908 B1 | 5/2002 | Schmidt et al. |
| 6,390,982 B1 | 5/2002 | Bova et al. |
| 6,402,762 B2 | 6/2002 | Hunter et al. |
| 6,405,072 B1 | 6/2002 | Cosman |
| 6,467,905 B1 | 10/2002 | Stahl et al. |
| 6,474,159 B1 | 11/2002 | Foxlin et al. |
| 6,484,131 B1 | 11/2002 | Amoral-Moriya et al. |
| 6,490,475 B1 | 12/2002 | Seeley et al. |
| 6,621,889 B1 | 9/2003 | Mostafavi |
| 6,650,920 B2 | 11/2003 | Schaldach et al. |
| 6,662,036 B2 | 12/2003 | Cosman |
| 6,687,528 B2 | 2/2004 | Gupta et al. |
| 6,690,965 B1 | 2/2004 | Riaziat et al. |
| 6,711,431 B2 | 3/2004 | Sarin et al. |
| 6,731,970 B2 | 5/2004 | Schlossbauer et al. |
| 6,758,218 B2 | 7/2004 | Anthony |
| 6,771,997 B2 | 8/2004 | Schaffer |
| 6,794,869 B2 | 9/2004 | Brittain |
| 6,856,827 B2 | 2/2005 | Seeley et al. |
| 6,856,828 B2 | 2/2005 | Cossette et al. |
| 6,876,198 B2 | 4/2005 | Watanabe et al. |
| 6,891,374 B2 | 5/2005 | Brittain |
| 6,892,089 B1 | 5/2005 | Prince et al. |
| 6,897,655 B2 | 5/2005 | Brittain et al. |
| 6,913,603 B2 | 7/2005 | Knopp et al. |
| 6,937,696 B1 | 8/2005 | Mostafavi |
| 6,959,266 B1 | 10/2005 | Mostafavi |
| 6,973,202 B2 | 12/2005 | Mostafavi |
| 6,980,679 B2 | 12/2005 | Jeung et al. |
| 7,007,699 B2 | 3/2006 | Martinelli et al. |
| 7,107,091 B2 | 9/2006 | Jutras et al. |
| 7,110,805 B2 | 9/2006 | Machida |
| 7,123,758 B2 | 10/2006 | Jeung et al. |
| 7,171,257 B2 | 1/2007 | Thomson |
| 7,191,100 B2 | 3/2007 | Mostafavi |
| 7,204,254 B2 | 4/2007 | Riaziat et al. |
| 7,209,777 B2 | 4/2007 | Saranathan et al. |
| 7,209,977 B2 | 4/2007 | Acharya et al. |
| 7,260,253 B2 | 8/2007 | Rahn et al. |
| 7,260,426 B2 | 8/2007 | Schweikard et al. |
| 7,295,007 B2 | 11/2007 | Dold |
| 7,313,430 B2 | 12/2007 | Urquhart et al. |
| 7,327,865 B2 | 2/2008 | Fu et al. |
| 7,348,776 B1 | 3/2008 | Aksoy et al. |
| 7,403,638 B2 | 7/2008 | Jeung et al. |
| 7,498,811 B2 | 3/2009 | Macfarlane et al. |
| 7,505,805 B2 | 3/2009 | Kuroda |
| 7,535,411 B2 | 5/2009 | Falco |
| 7,551,089 B2 | 6/2009 | Sawyer |
| 7,561,909 B1 | 7/2009 | Pai et al. |
| 7,567,697 B2 | 7/2009 | Mostafavi |
| 7,573,269 B2 * | 8/2009 | Yao .................. G01R 33/5673 324/307 |
| 7,602,301 B1 | 10/2009 | Stirling et al. |
| 7,603,155 B2 | 10/2009 | Jensen |
| 7,623,623 B2 | 11/2009 | Raanes et al. |
| 7,657,300 B2 | 2/2010 | Hunter et al. |
| 7,657,301 B2 | 2/2010 | Mate et al. |
| 7,659,521 B2 | 2/2010 | Pedroni |
| 7,660,623 B2 | 2/2010 | Hunter et al. |
| 7,668,288 B2 | 2/2010 | Conwell et al. |
| 7,689,263 B1 | 3/2010 | Fung et al. |
| 7,715,604 B2 | 5/2010 | Sun et al. |
| 7,742,077 B2 | 6/2010 | Sablak et al. |
| 7,742,621 B2 | 6/2010 | Hammoud et al. |
| 7,742,804 B2 | 6/2010 | Faul et al. |
| 7,744,528 B2 | 6/2010 | Wallace et al. |
| 7,760,908 B2 | 7/2010 | Curtner et al. |
| 7,766,837 B2 | 8/2010 | Pedrizzetti et al. |
| 7,769,430 B2 | 8/2010 | Mostafavi |
| 7,772,569 B2 | 8/2010 | Bewersdorf et al. |
| 7,787,011 B2 | 8/2010 | Zhou et al. |
| 7,791,808 B2 | 9/2010 | French et al. |
| 7,792,249 B2 | 9/2010 | Gertner et al. |
| 7,796,154 B2 | 9/2010 | Senior et al. |
| 7,798,730 B2 | 9/2010 | Westerweck |
| 7,801,330 B2 | 9/2010 | Zhang et al. |
| 7,805,987 B1 | 10/2010 | Smith |
| 7,806,604 B2 | 10/2010 | Bazakos et al. |
| 7,817,046 B2 | 10/2010 | Coveley et al. |
| 7,817,824 B2 | 10/2010 | Liang et al. |
| 7,819,818 B2 | 10/2010 | Ghajar |
| 7,833,221 B2 | 11/2010 | Voegele |
| 7,834,846 B1 | 11/2010 | Bell |
| 7,835,783 B1 | 11/2010 | Aletras |
| 7,839,551 B2 | 11/2010 | Lee et al. |
| 7,840,253 B2 | 11/2010 | Tremblay et al. |
| 7,844,320 B2 | 11/2010 | Shahidi |
| 7,850,526 B2 | 12/2010 | Zalewski et al. |
| 7,860,301 B2 | 12/2010 | Se et al. |
| 7,866,818 B2 | 1/2011 | Schroeder et al. |
| 7,868,282 B2 | 1/2011 | Lee et al. |
| 7,878,652 B2 | 2/2011 | Chen et al. |
| 7,883,415 B2 | 2/2011 | Larsen et al. |
| 7,889,907 B2 | 2/2011 | Engelbart et al. |
| 7,894,877 B2 | 2/2011 | Lewin et al. |
| 7,902,825 B2 | 3/2011 | Bammer et al. |
| 7,907,987 B2 | 3/2011 | Dempsey |
| 7,908,060 B2 | 3/2011 | Basson et al. |
| 7,908,233 B2 | 3/2011 | Angell et al. |
| 7,911,207 B2 | 3/2011 | Macfarlane et al. |
| 7,912,532 B2 | 3/2011 | Schmidt et al. |
| 7,920,250 B2 | 4/2011 | Robert et al. |
| 7,920,911 B2 | 4/2011 | Hoshino et al. |
| 7,925,066 B2 | 4/2011 | Ruohonen et al. |
| 7,925,549 B2 | 4/2011 | Looney et al. |
| 7,931,370 B2 | 4/2011 | Bartomen |
| 7,944,354 B2 | 5/2011 | Kangas et al. |
| 7,944,454 B2 | 5/2011 | Zhou et al. |
| 7,945,304 B2 | 5/2011 | Feinberg |
| 7,946,921 B2 | 5/2011 | Ofek et al. |
| 7,962,197 B2 | 6/2011 | Rioux et al. |
| 7,971,999 B2 | 7/2011 | Zinser |
| 7,977,942 B2 | 7/2011 | White |
| 7,978,925 B1 | 7/2011 | Souchard |
| 7,988,288 B2 | 8/2011 | Donaldson |
| 7,990,365 B2 | 8/2011 | Marvit et al. |
| 8,009,198 B2 | 8/2011 | Alhadef |
| 8,019,170 B2 | 9/2011 | Wang et al. |
| 8,021,231 B2 | 9/2011 | Walker et al. |
| 8,022,982 B2 | 9/2011 | Thorn |
| 8,024,026 B2 | 9/2011 | Groszmann |
| 8,031,909 B2 | 10/2011 | Se et al. |
| 8,031,933 B2 | 10/2011 | Se et al. |
| 8,036,425 B2 | 10/2011 | Hou |
| 8,041,077 B2 | 10/2011 | Bell |
| 8,041,412 B2 | 10/2011 | Glossop et al. |
| 8,048,002 B2 | 11/2011 | Ghajar |
| 8,049,867 B2 | 11/2011 | Bridges et al. |
| 8,055,020 B2 | 11/2011 | Meuter et al. |
| 8,060,185 B2 | 11/2011 | Hunter et al. |
| 8,063,929 B2 | 11/2011 | Kurtz et al. |
| 8,073,197 B2 | 12/2011 | Xu et al. |
| 8,077,914 B1 | 12/2011 | Kaplan |
| 8,085,302 B2 | 12/2011 | Zhang et al. |
| 8,086,026 B2 | 12/2011 | Schulz |
| 8,086,299 B2 | 12/2011 | Adler et al. |
| RE43,147 E | 1/2012 | Aviv |
| 8,094,193 B2 | 1/2012 | Peterson |
| 8,095,209 B2 | 1/2012 | Flaherty |
| 8,098,889 B2 | 1/2012 | Zhu et al. |
| 8,113,991 B2 | 2/2012 | Kutliroff |

(56) References Cited

U.S. PATENT DOCUMENTS

| | | |
|---|---|---|
| 8,116,527 B2 | 2/2012 | Sabol |
| 8,121,356 B2 | 2/2012 | Friedman |
| 8,121,361 B2 | 2/2012 | Ernst |
| 8,134,597 B2 | 3/2012 | Thorn |
| 8,135,201 B2 | 3/2012 | Smith et al. |
| 8,139,029 B2 | 3/2012 | Boillot |
| 8,139,896 B1 | 3/2012 | Ahiska |
| 8,144,118 B2 | 3/2012 | Hildreth |
| 8,144,148 B2 | 3/2012 | El Dokor |
| 8,150,063 B2 | 4/2012 | Chen |
| 8,150,498 B2 | 4/2012 | Gielen et al. |
| 8,160,304 B2 | 4/2012 | Rhoads |
| 8,165,844 B2 | 4/2012 | Luinge et al. |
| 8,167,802 B2 | 5/2012 | Baba et al. |
| 8,172,573 B2 | 5/2012 | Sonenfeld et al. |
| 8,175,332 B2 | 5/2012 | Herrington |
| 8,179,604 B1 | 5/2012 | Prada Gomez |
| 8,180,428 B2 | 5/2012 | Kaiser et al. |
| 8,180,432 B2 | 5/2012 | Sayeh |
| 8,187,097 B1 | 5/2012 | Zhang |
| 8,189,869 B2 | 5/2012 | Bell |
| 8,189,889 B2 | 5/2012 | Pearlstein et al. |
| 8,189,926 B2 | 5/2012 | Sharma |
| 8,190,233 B2 | 5/2012 | Dempsey |
| 8,194,134 B2 | 6/2012 | Furukawa |
| 8,195,084 B2 | 6/2012 | Xiao |
| 8,199,983 B2 | 6/2012 | Qureshi |
| 8,206,219 B2 | 6/2012 | Shum |
| 8,207,967 B1 | 6/2012 | El Dokor |
| 8,208,758 B2 | 6/2012 | Wang |
| 8,213,693 B1 | 7/2012 | Li |
| 8,214,012 B2 | 7/2012 | Zuccolotto et al. |
| 8,214,016 B2 | 7/2012 | Lavallee et al. |
| 8,216,016 B2 | 7/2012 | Yamagishi et al. |
| 8,218,818 B2 | 7/2012 | Cobb |
| 8,218,819 B2 | 7/2012 | Cobb |
| 8,218,825 B2 | 7/2012 | Gordon |
| 8,221,399 B2 | 7/2012 | Amano |
| 8,223,147 B1 | 7/2012 | El Dokor |
| 8,224,423 B2 | 7/2012 | Faul |
| 8,226,574 B2 | 7/2012 | Whillock |
| 8,229,163 B2 | 7/2012 | Coleman |
| 8,229,166 B2 | 7/2012 | Teng |
| 8,229,184 B2 | 7/2012 | Benkley |
| 8,232,872 B2 | 7/2012 | Zeng |
| 8,235,529 B1 | 8/2012 | Raffle |
| 8,235,530 B2 | 8/2012 | Maad |
| 8,241,125 B2 | 8/2012 | Huges |
| 8,243,136 B2 | 8/2012 | Aota |
| 8,243,269 B2 | 8/2012 | Matousek |
| 8,243,996 B2 | 8/2012 | Steinberg |
| 8,248,372 B2 | 8/2012 | Saila |
| 8,249,691 B2 | 8/2012 | Chase et al. |
| 8,253,770 B2 | 8/2012 | Kurtz |
| 8,253,774 B2 | 8/2012 | Huitema |
| 8,253,778 B2 | 8/2012 | Atsushi |
| 8,259,109 B2 | 9/2012 | El Dokor |
| 8,279,288 B2 | 10/2012 | Son |
| 8,284,157 B2 | 10/2012 | Markovic |
| 8,284,847 B2 | 10/2012 | Adermann |
| 8,287,373 B2 | 10/2012 | Marks et al. |
| 8,289,390 B2 | 10/2012 | Aggarwal |
| 8,289,392 B2 | 10/2012 | Senior et al. |
| 8,290,208 B2 | 10/2012 | Kurtz |
| 8,290,229 B2 | 10/2012 | Qureshi |
| 8,301,226 B2 | 10/2012 | Csavoy et al. |
| 8,306,260 B2 | 11/2012 | Zhu |
| 8,306,267 B1 | 11/2012 | Gossweiler, III |
| 8,306,274 B2 | 11/2012 | Grycewicz |
| 8,306,663 B2 | 11/2012 | Wickham |
| 8,310,656 B2 | 11/2012 | Zalewski |
| 8,310,662 B2 | 11/2012 | Mehr |
| 8,311,611 B2 | 11/2012 | Csavoy et al. |
| 8,314,854 B2 | 11/2012 | Yoon |
| 8,315,691 B2 | 11/2012 | Sumanaweera et al. |
| 8,316,324 B2 | 11/2012 | Boillot |
| 8,320,621 B2 | 11/2012 | McEldowney |
| 8,323,106 B2 | 12/2012 | Zalewski |
| 8,325,228 B2 | 12/2012 | Mariadoss |
| 8,330,811 B2 | 12/2012 | Maguire, Jr. |
| 8,330,812 B2 | 12/2012 | Maguire, Jr. |
| 8,331,019 B2 | 12/2012 | Cheong |
| 8,334,900 B2 | 12/2012 | Qu et al. |
| 8,339,282 B2 | 12/2012 | Noble |
| 8,351,651 B2 | 1/2013 | Lee |
| 8,368,586 B2 | 2/2013 | Mohamadi |
| 8,369,574 B2 | 2/2013 | Hu |
| 8,374,393 B2 | 2/2013 | Cobb |
| 8,374,411 B2 | 2/2013 | Ernst et al. |
| 8,374,674 B2 | 2/2013 | Gertner |
| 8,376,226 B2 | 2/2013 | Dennard |
| 8,376,827 B2 | 2/2013 | Cammegh |
| 8,379,927 B2 | 2/2013 | Taylor |
| 8,380,284 B2 | 2/2013 | Saranathan |
| 8,386,011 B2 | 2/2013 | Wieczorek |
| 8,390,291 B2 | 3/2013 | Macfarlane et al. |
| 8,390,729 B2 | 3/2013 | Long |
| 8,395,620 B2 | 3/2013 | El Dokor |
| 8,400,398 B2 | 3/2013 | Schoen et al. |
| 8,400,490 B2 | 3/2013 | Apostolopoulos |
| 8,405,491 B2 | 3/2013 | Fong |
| 8,405,656 B2 | 3/2013 | El Dokor |
| 8,405,717 B2 | 3/2013 | Kim |
| 8,406,845 B2 | 3/2013 | Komistek |
| 8,411,931 B2 | 4/2013 | Zhou |
| 8,427,538 B2 | 4/2013 | Ahiska |
| 8,428,319 B2 | 4/2013 | Tsin |
| 8,571,293 B2 | 10/2013 | Ernst et al. |
| 8,615,127 B2 | 12/2013 | Fitzpatrick |
| 8,744,154 B2 | 6/2014 | Van Den Brink |
| 9,076,212 B2 | 7/2015 | Ernst et al. |
| 9,103,897 B2 | 8/2015 | Herbst et al. |
| 9,138,175 B2 | 9/2015 | Ernst et al. |
| 2002/0082496 A1 | 6/2002 | Kuth |
| 2002/0091422 A1 | 7/2002 | Greenberg et al. |
| 2002/0115931 A1 | 8/2002 | Strauss et al. |
| 2002/0180436 A1* | 12/2002 | Dale .............. G01R 33/56509 324/307 |
| 2002/0188194 A1 | 12/2002 | Cosman |
| 2003/0063292 A1 | 4/2003 | Mostafavi |
| 2003/0088177 A1 | 5/2003 | Totterman et al. |
| 2003/0116166 A1 | 6/2003 | Anthony |
| 2003/0130574 A1 | 7/2003 | Stoyle |
| 2004/0071324 A1* | 4/2004 | Norris ............ G01R 33/56509 382/128 |
| 2004/0116804 A1 | 6/2004 | Mostafavi |
| 2004/0140804 A1 | 7/2004 | Polzin et al. |
| 2004/0171927 A1 | 9/2004 | Lowen et al. |
| 2005/0027194 A1 | 2/2005 | Adler et al. |
| 2005/0054910 A1 | 3/2005 | Tremblay et al. |
| 2005/0105772 A1 | 5/2005 | Voronka et al. |
| 2005/0107685 A1 | 5/2005 | Seeber |
| 2005/0137475 A1 | 6/2005 | Dold et al. |
| 2005/0283068 A1 | 12/2005 | Zuccoloto et al. |
| 2006/0004281 A1 | 1/2006 | Saracen |
| 2006/0045310 A1 | 3/2006 | Tu et al. |
| 2006/0074292 A1 | 4/2006 | Thomson et al. |
| 2006/0241405 A1 | 10/2006 | Leitner et al. |
| 2007/0093709 A1 | 4/2007 | Abernathie |
| 2007/0239169 A1 | 10/2007 | Plaskos et al. |
| 2008/0039713 A1 | 2/2008 | Thomson et al. |
| 2008/0181358 A1 | 7/2008 | Van Kampen et al. |
| 2008/0183074 A1 | 7/2008 | Carls et al. |
| 2008/0212835 A1 | 9/2008 | Tavor |
| 2008/0221442 A1 | 9/2008 | Tolkowsky et al. |
| 2008/0273754 A1 | 11/2008 | Hick et al. |
| 2008/0287780 A1 | 11/2008 | Chase et al. |
| 2008/0317313 A1 | 12/2008 | Goddard et al. |
| 2009/0028411 A1 | 1/2009 | Pfeuffer |
| 2009/0052760 A1 | 2/2009 | Smith et al. |
| 2009/0185663 A1 | 7/2009 | Gaines, Jr. et al. |
| 2009/0209846 A1 | 8/2009 | Bammer |
| 2009/0253985 A1 | 10/2009 | Shachar et al. |
| 2009/0304297 A1 | 12/2009 | Adabala et al. |

(56) References Cited

U.S. PATENT DOCUMENTS

| | | |
|---|---|---|
| 2009/0306499 A1 | 12/2009 | Van Vorhis et al. |
| 2010/0057059 A1 | 3/2010 | Makino |
| 2010/0069742 A1 | 3/2010 | Partain et al. |
| 2010/0091089 A1 | 4/2010 | Cromwell et al. |
| 2010/0099981 A1 | 4/2010 | Fishel |
| 2010/0125191 A1 | 5/2010 | Sahin |
| 2010/0137709 A1 | 6/2010 | Gardner et al. |
| 2010/0148774 A1 | 6/2010 | Kamata |
| 2010/0149099 A1 | 6/2010 | Elias |
| 2010/0149315 A1 | 6/2010 | Qu |
| 2010/0160775 A1 | 6/2010 | Pankratov |
| 2010/0164862 A1 | 7/2010 | Sullivan |
| 2010/0165293 A1 | 7/2010 | Tanassi |
| 2010/0167246 A1 | 7/2010 | Ghajar |
| 2010/0172567 A1 | 7/2010 | Prokoski |
| 2010/0177929 A1 | 7/2010 | Kurtz |
| 2010/0178966 A1 | 7/2010 | Suydoux |
| 2010/0179390 A1 | 7/2010 | Davis |
| 2010/0179413 A1 | 7/2010 | Kadour |
| 2010/0183196 A1 | 7/2010 | Fu et al. |
| 2010/0191631 A1 | 7/2010 | Weidmann |
| 2010/0194879 A1 | 8/2010 | Pasveer |
| 2010/0198067 A1 | 8/2010 | Mahfouz |
| 2010/0198101 A1 | 8/2010 | Song |
| 2010/0198112 A1 | 8/2010 | Maad |
| 2010/0199232 A1 | 8/2010 | Mistry |
| 2010/0210350 A9 | 8/2010 | Walker |
| 2010/0214267 A1 | 8/2010 | Radivojevic |
| 2010/0231511 A1 | 9/2010 | Henty |
| 2010/0231692 A1 | 9/2010 | Perlman |
| 2010/0245536 A1 | 9/2010 | Huitema |
| 2010/0245593 A1 | 9/2010 | Kim |
| 2010/0251924 A1 | 10/2010 | Taylor |
| 2010/0253762 A1 | 10/2010 | Cheong |
| 2010/0268072 A1 | 10/2010 | Hall et al. |
| 2010/0282902 A1 | 11/2010 | Rajasingham |
| 2010/0283833 A1 | 11/2010 | Yeh |
| 2010/0284119 A1 | 11/2010 | Coakley |
| 2010/0289899 A1 | 11/2010 | Hendron |
| 2010/0290668 A1 | 11/2010 | Friedman |
| 2010/0292841 A1 | 11/2010 | Wickham |
| 2010/0295718 A1 | 11/2010 | Mohamadi |
| 2010/0296701 A1 | 11/2010 | Hu |
| 2010/0302142 A1 | 12/2010 | French |
| 2010/0303289 A1 | 12/2010 | Polzin |
| 2010/0311512 A1 | 12/2010 | Lock |
| 2010/0321505 A1 | 12/2010 | Kokubun |
| 2010/0328055 A1 | 12/2010 | Fong |
| 2010/0328201 A1 | 12/2010 | Marbit |
| 2010/0328267 A1 | 12/2010 | Chen |
| 2010/0330912 A1 | 12/2010 | Saila |
| 2011/0001699 A1 | 1/2011 | Jacobsen |
| 2011/0006991 A1 | 1/2011 | Elias |
| 2011/0007939 A1 | 1/2011 | Teng |
| 2011/0007946 A1 | 1/2011 | Liang |
| 2011/0008759 A1 | 1/2011 | Usui |
| 2011/0015521 A1 | 1/2011 | Faul |
| 2011/0019001 A1 | 1/2011 | Rhoads |
| 2011/0025853 A1 | 2/2011 | Richardson |
| 2011/0038520 A1 | 2/2011 | Yui |
| 2011/0043631 A1 | 2/2011 | Marman |
| 2011/0043759 A1 | 2/2011 | Bushinsky |
| 2011/0050562 A1 | 3/2011 | Schoen |
| 2011/0050569 A1 | 3/2011 | Marvit |
| 2011/0050947 A1 | 3/2011 | Marman |
| 2011/0052002 A1 | 3/2011 | Cobb |
| 2011/0052003 A1 | 3/2011 | Cobb |
| 2011/0052015 A1 | 3/2011 | Saund |
| 2011/0054870 A1 | 3/2011 | Dariush |
| 2011/0057816 A1 | 3/2011 | Noble |
| 2011/0058020 A1 | 3/2011 | Dieckmann |
| 2011/0069207 A1 | 3/2011 | Steinberg |
| 2011/0074675 A1 | 3/2011 | Shiming |
| 2011/0081000 A1 | 4/2011 | Gertner |
| 2011/0081043 A1 | 4/2011 | Sabol |
| 2011/0085704 A1 | 4/2011 | Han |
| 2011/0092781 A1 | 4/2011 | Gertner |
| 2011/0102549 A1 | 5/2011 | Takahashi |
| 2011/0105883 A1 | 5/2011 | Lake et al. |
| 2011/0105893 A1 | 5/2011 | Akins |
| 2011/0115793 A1 | 5/2011 | Grycewicz |
| 2011/0115892 A1 | 5/2011 | Fan |
| 2011/0116683 A1 | 5/2011 | Kramer et al. |
| 2011/0117528 A1 | 5/2011 | Marciello et al. |
| 2011/0118032 A1 | 5/2011 | Zalewski |
| 2011/0133917 A1 | 6/2011 | Zeng |
| 2011/0142411 A1 | 6/2011 | Camp |
| 2011/0150271 A1 | 6/2011 | Lee |
| 2011/0157168 A1 | 6/2011 | Bennett |
| 2011/0157358 A1 | 6/2011 | Bell |
| 2011/0157370 A1 | 6/2011 | Livesey |
| 2011/0160569 A1 | 6/2011 | Cohen et al. |
| 2011/0172060 A1 | 7/2011 | Morales |
| 2011/0172521 A1 | 7/2011 | Zdeblick et al. |
| 2011/0175801 A1 | 7/2011 | Markovic |
| 2011/0175809 A1 | 7/2011 | Markovic |
| 2011/0175810 A1 | 7/2011 | Markovic |
| 2011/0176723 A1 | 7/2011 | Ali et al. |
| 2011/0180695 A1 | 7/2011 | Li |
| 2011/0181893 A1 | 7/2011 | MacFarlane |
| 2011/0182472 A1 | 7/2011 | Hansen |
| 2011/0187640 A1 | 8/2011 | Jacobsen |
| 2011/0193939 A1 | 8/2011 | Vassigh |
| 2011/0199461 A1 | 8/2011 | Horio |
| 2011/0201916 A1* | 8/2011 | Duyn .................. G01R 33/283 600/410 |
| 2011/0201939 A1 | 8/2011 | Hubschman et al. |
| 2011/0202306 A1 | 8/2011 | Eng |
| 2011/0205358 A1 | 8/2011 | Aota |
| 2011/0207089 A1 | 8/2011 | Lagettie |
| 2011/0208437 A1 | 8/2011 | Teicher |
| 2011/0216002 A1 | 9/2011 | Weising |
| 2011/0216180 A1 | 9/2011 | Pasini |
| 2011/0221770 A1 | 9/2011 | Kruglick |
| 2011/0229862 A1 | 9/2011 | Parikh |
| 2011/0230755 A1 | 9/2011 | MacFarlane et al. |
| 2011/0234807 A1 | 9/2011 | Jones |
| 2011/0234834 A1 | 9/2011 | Sugimoto |
| 2011/0235855 A1 | 9/2011 | Smith |
| 2011/0237933 A1 | 9/2011 | Cohen |
| 2011/0242134 A1 | 10/2011 | Miller |
| 2011/0244939 A1 | 10/2011 | Cammegh |
| 2011/0250929 A1 | 10/2011 | Lin |
| 2011/0251478 A1 | 10/2011 | Wieczorek |
| 2011/0255845 A1 | 10/2011 | Kikuchi |
| 2011/0257566 A1 | 10/2011 | Burdea |
| 2011/0260965 A1 | 10/2011 | Kim |
| 2011/0262002 A1 | 10/2011 | Lee |
| 2011/0267427 A1 | 11/2011 | Goh |
| 2011/0267456 A1 | 11/2011 | Adermann |
| 2011/0276396 A1 | 11/2011 | Rathod |
| 2011/0279663 A1 | 11/2011 | Fan |
| 2011/0285622 A1 | 11/2011 | Marti |
| 2011/0286010 A1 | 11/2011 | Kusik et al. |
| 2011/0291925 A1 | 12/2011 | Isarel |
| 2011/0293143 A1 | 12/2011 | Narayanan et al. |
| 2011/0293146 A1 | 12/2011 | Grycewicz |
| 2011/0298708 A1 | 12/2011 | Hsu |
| 2011/0298824 A1 | 12/2011 | Lee |
| 2011/0300994 A1 | 12/2011 | Verkaaik |
| 2011/0301449 A1 | 12/2011 | Maurer, Jr. |
| 2011/0301934 A1 | 12/2011 | Tardis |
| 2011/0303214 A1 | 12/2011 | Welle |
| 2011/0304541 A1 | 12/2011 | Dalal |
| 2011/0304650 A1 | 12/2011 | Canpillo |
| 2011/0304706 A1 | 12/2011 | Border et al. |
| 2011/0306867 A1 | 12/2011 | Gopinadhan |
| 2011/0310220 A1 | 12/2011 | McEldowney |
| 2011/0310226 A1 | 12/2011 | McEldowney |
| 2011/0316994 A1 | 12/2011 | Lemchen |
| 2011/0317877 A1 | 12/2011 | Bell |
| 2012/0002112 A1 | 1/2012 | Huang |
| 2012/0004791 A1 | 1/2012 | Buelthoff |
| 2012/0007839 A1 | 1/2012 | Tsao et al. |

(56) References Cited

U.S. PATENT DOCUMENTS

| | | |
|---|---|---|
| 2012/0019645 A1 | 1/2012 | Maltz |
| 2012/0020524 A1 | 1/2012 | Ishikawa |
| 2012/0021806 A1 | 1/2012 | Maltz |
| 2012/0027226 A1 | 2/2012 | Desenberg |
| 2012/0029345 A1 | 2/2012 | Mahfouz et al. |
| 2012/0032882 A1 | 2/2012 | Schlachta |
| 2012/0033083 A1 | 2/2012 | Horvinger |
| 2012/0035462 A1 | 2/2012 | Maurer, Jr. et al. |
| 2012/0039505 A1 | 2/2012 | Bastide et al. |
| 2012/0044363 A1 | 2/2012 | Lu |
| 2012/0045091 A1 | 2/2012 | Kaganovich |
| 2012/0049453 A1 | 3/2012 | Morichau-Beauchant |
| 2012/0051588 A1 | 3/2012 | McEldowney |
| 2012/0051664 A1 | 3/2012 | Gopalakrishnan et al. |
| 2012/0052949 A1 | 3/2012 | Weitzner |
| 2012/0056982 A1 | 3/2012 | Katz |
| 2012/0057640 A1 | 3/2012 | Shi |
| 2012/0065492 A1 | 3/2012 | Gertner et al. |
| 2012/0065494 A1 | 3/2012 | Gertner et al. |
| 2012/0072041 A1 | 3/2012 | Miller |
| 2012/0075166 A1 | 3/2012 | Marti |
| 2012/0075177 A1 | 3/2012 | Jacobsen |
| 2012/0076369 A1 | 3/2012 | Abramovich |
| 2012/0081504 A1 | 4/2012 | Ng |
| 2012/0083314 A1 | 4/2012 | Ng |
| 2012/0083960 A1 | 4/2012 | Zhu |
| 2012/0086778 A1 | 4/2012 | Lee |
| 2012/0086809 A1 | 4/2012 | Lee |
| 2012/0092445 A1 | 4/2012 | McDowell |
| 2012/0092502 A1 | 4/2012 | Knasel |
| 2012/0093481 A1 | 4/2012 | McDowell |
| 2012/0098938 A1 | 4/2012 | Jin |
| 2012/0101388 A1 | 4/2012 | Tripathi |
| 2012/0105573 A1 | 5/2012 | Apostolopoulos |
| 2012/0106814 A1 | 5/2012 | Gleason et al. |
| 2012/0108909 A1 | 5/2012 | Soobounov |
| 2012/0113140 A1 | 5/2012 | Hilliges |
| 2012/0113223 A1 | 5/2012 | Hilliges |
| 2012/0116202 A1 | 5/2012 | Bangera |
| 2012/0119999 A1 | 5/2012 | Harris |
| 2012/0120072 A1 | 5/2012 | Se |
| 2012/0120237 A1 | 5/2012 | Trepess |
| 2012/0120243 A1 | 5/2012 | Chien |
| 2012/0120277 A1 | 5/2012 | Tsai |
| 2012/0121124 A1 | 5/2012 | Bammer |
| 2012/0124604 A1 | 5/2012 | Small |
| 2012/0127319 A1 | 5/2012 | Rao |
| 2012/0133616 A1 | 5/2012 | Nishihara |
| 2012/0133889 A1 | 5/2012 | Bergt |
| 2012/0143029 A1 | 6/2012 | Silverstein |
| 2012/0143212 A1 | 6/2012 | Madhani |
| 2012/0154272 A1 | 6/2012 | Hildreth |
| 2012/0154511 A1 | 6/2012 | Hsu |
| 2012/0154536 A1 | 6/2012 | Stoker |
| 2012/0154579 A1 | 6/2012 | Hanpapur |
| 2012/0156661 A1 | 6/2012 | Smith |
| 2012/0158197 A1 | 6/2012 | Hinman |
| 2012/0162378 A1 | 6/2012 | El Dokor |
| 2012/0165964 A1 | 6/2012 | Flaks |
| 2012/0167143 A1 | 6/2012 | Longet |
| 2012/0169841 A1 | 7/2012 | Chemali |
| 2012/0176314 A1 | 7/2012 | Jeon |
| 2012/0184371 A1 | 7/2012 | Shum |
| 2012/0188237 A1 | 7/2012 | Han |
| 2012/0188371 A1 | 7/2012 | Chen |
| 2012/0194422 A1 | 8/2012 | El Dokor |
| 2012/0194517 A1 | 8/2012 | Ivadi |
| 2012/0194561 A1 | 8/2012 | Grossinger |
| 2012/0195466 A1 | 8/2012 | Teng |
| 2012/0196660 A1 | 8/2012 | Eo Dokor |
| 2012/0197135 A1 | 8/2012 | Slatkine |
| 2012/0200676 A1 | 8/2012 | Huitema |
| 2012/0201428 A1 | 8/2012 | Joshi |
| 2012/0206604 A1 | 8/2012 | Jones |
| 2012/0212594 A1 | 8/2012 | Barns |
| 2012/0218407 A1 | 8/2012 | Chien |
| 2012/0218421 A1 | 8/2012 | Chien |
| 2012/0220233 A1 | 8/2012 | Teague |
| 2012/0224666 A1 | 9/2012 | Speller |
| 2012/0224743 A1 | 9/2012 | Rodriguez |
| 2012/0225718 A1 | 9/2012 | Zhang |
| 2012/0229643 A1 | 9/2012 | Chidanand |
| 2012/0229651 A1 | 9/2012 | Takizawa |
| 2012/0230561 A1 | 9/2012 | Qureshi |
| 2012/0235896 A1 | 9/2012 | Jacobsen |
| 2012/0238337 A1 | 9/2012 | French |
| 2012/0242816 A1 | 9/2012 | Cruz |
| 2012/0249741 A1 | 10/2012 | Maciocci |
| 2012/0253201 A1 | 10/2012 | Reinhold |
| 2012/0253241 A1 | 10/2012 | Levital et al. |
| 2012/0262540 A1 | 10/2012 | Rondinelli |
| 2012/0262558 A1 | 10/2012 | Boger |
| 2012/0262583 A1 | 10/2012 | Bernal |
| 2012/0268124 A1* | 10/2012 | Herbst ............... G01R 33/5673 324/309 |
| 2012/0275649 A1 | 11/2012 | Cobb |
| 2012/0276995 A1 | 11/2012 | Lansdale |
| 2012/0277001 A1 | 11/2012 | Lansdale |
| 2012/0281093 A1 | 11/2012 | Fong |
| 2012/0281873 A1 | 11/2012 | Brown |
| 2012/0288142 A1 | 11/2012 | Gossweiler, III |
| 2012/0288143 A1 | 11/2012 | Ernst et al. |
| 2012/0288852 A1 | 11/2012 | Willson |
| 2012/0289334 A9 | 11/2012 | Mikhailov |
| 2012/0289822 A1 | 11/2012 | Shachar et al. |
| 2012/0293412 A1 | 11/2012 | El Dokor |
| 2012/0293506 A1 | 11/2012 | Vertucci |
| 2012/0293663 A1 | 11/2012 | Liu |
| 2012/0294511 A1 | 11/2012 | Datta |
| 2012/0300961 A1 | 11/2012 | Moeller |
| 2012/0303839 A1 | 11/2012 | Jackson |
| 2012/0304126 A1 | 11/2012 | Lavigne |
| 2012/0307075 A1 | 12/2012 | Margalit |
| 2012/0307207 A1 | 12/2012 | Abraham |
| 2012/0314066 A1 | 12/2012 | Lee |
| 2012/0315016 A1 | 12/2012 | Fung |
| 2012/0319946 A1 | 12/2012 | El Dokor |
| 2012/0319989 A1 | 12/2012 | Argiro |
| 2012/0320178 A1 | 12/2012 | Siegert et al. |
| 2012/0320219 A1 | 12/2012 | David |
| 2012/0326966 A1 | 12/2012 | Rauber |
| 2012/0326979 A1 | 12/2012 | Geisert |
| 2012/0327241 A1 | 12/2012 | Howe |
| 2012/0327246 A1 | 12/2012 | Senior et al. |
| 2013/0002866 A1 | 1/2013 | Hanpapur |
| 2013/0002879 A1 | 1/2013 | Weber |
| 2013/0002900 A1 | 1/2013 | Gossweiler, III |
| 2013/0009865 A1 | 1/2013 | Valik |
| 2013/0010071 A1 | 1/2013 | Valik |
| 2013/0013452 A1 | 1/2013 | Dennard |
| 2013/0016009 A1 | 1/2013 | Godfrey |
| 2013/0016876 A1 | 1/2013 | Wooley |
| 2013/0021434 A1 | 1/2013 | Ahiska |
| 2013/0021578 A1 | 1/2013 | Chen |
| 2013/0024819 A1 | 1/2013 | Rieffel |
| 2013/0030283 A1 | 1/2013 | Vortman et al. |
| 2013/0033640 A1 | 2/2013 | Lee |
| 2013/0033700 A1 | 2/2013 | Hallil |
| 2013/0035590 A1 | 2/2013 | Ma et al. |
| 2013/0035612 A1 | 2/2013 | Mason |
| 2013/0040720 A1 | 2/2013 | Cammegh |
| 2013/0041368 A1 | 2/2013 | Cunningham |
| 2013/0057702 A1 | 3/2013 | Chavan |
| 2013/0064426 A1 | 3/2013 | Watkins, Jr. |
| 2013/0064427 A1 | 3/2013 | Picard |
| 2013/0065517 A1 | 3/2013 | Svensson |
| 2013/0066448 A1 | 3/2013 | Alonso |
| 2013/0066526 A1 | 3/2013 | Mondragon |
| 2013/0069773 A1 | 3/2013 | Li |
| 2013/0070201 A1 | 3/2013 | Shahidi |
| 2013/0070257 A1 | 3/2013 | Wong |
| 2013/0072787 A1 | 3/2013 | Wallace et al. |
| 2013/0076863 A1 | 3/2013 | Rappel |
| 2013/0076944 A1 | 3/2013 | Kosaka |

(56) References Cited

U.S. PATENT DOCUMENTS

| | | |
|---|---|---|
| 2013/0077823 A1 | 3/2013 | Mestha |
| 2013/0079033 A1 | 3/2013 | Gupta |
| 2013/0084980 A1 | 4/2013 | Hammontree |
| 2013/0088584 A1 | 4/2013 | Malhas |
| 2013/0093866 A1 | 4/2013 | Ohlhues et al. |
| 2013/0096439 A1 | 4/2013 | Lee |
| 2013/0102879 A1 | 4/2013 | MacLaren et al. |
| 2013/0108979 A1 | 5/2013 | Daon |
| 2013/0113791 A1 | 5/2013 | Isaacs et al. |
| 2013/0211421 A1 | 8/2013 | Abovitz et al. |
| 2013/0281818 A1 | 10/2013 | Vija et al. |
| 2014/0037174 A1 | 2/2014 | Ernst et al. |
| 2014/0073908 A1 | 3/2014 | Biber |
| 2014/0159721 A1 | 6/2014 | Grodzki |
| 2015/0265220 A1 | 9/2015 | Ernst et al. |

FOREIGN PATENT DOCUMENTS

| | | |
|---|---|---|
| WO | WO 96/17258 | 6/1996 |
| WO | WO 00/72039 | 11/2000 |
| WO | WO 03/003796 | 1/2003 |
| WO | WO 2004/023783 | 3/2004 |
| WO | WO 2007/136745 | 11/2007 |
| WO | WO 2009/129457 A1 | 10/2009 |
| WO | WO 2011/113441 A2 | 9/2011 |
| WO | WO 2012/046202 A1 | 4/2012 |
| WO | WO 2013/032933 | 3/2013 |
| WO | WO 2014/005178 | 1/2014 |
| WO | WO 2014/116868 | 7/2014 |
| WO | WO 2014/120734 | 8/2014 |
| WO | WO 2015/092593 | 6/2015 |
| WO | WO 2015/148391 | 10/2015 |

OTHER PUBLICATIONS

Norris et al., "Online motion correction for diffusion-weighted imaging using navigator echoes: application to RARE imaging without sensitivity loss", Magnetic Resonance in Medicine, vol. 45:729-733 (2001).

Orchard et al., "MRI Reconstruction using real-time motion tracking: A simulation study", Signals, Systems and Computers, 42nd Annual Conference IEEE, Piscataway, NJ, USA (Oct. 26, 2008).

PCT Search Report from the International Searching Authority, dated Feb. 28, 2013, in 16 pages, regarding International Application No. PCT/US2012/052349.

International Preliminary Report on Patentability for Application No. PCT/US2007/011899, dated Jun. 8, 2008, in 13 pages.

International Search Report and Written Opinion for Application No. PCT/US2007/011899, dated Nov. 14, 2007.

International Search Report and Written Opinion for Application No. PCT/US2014/012806, dated May 15, 2014, in 15 pages.

U.S. Appl. No. 13/735,907, including its prosecution history, the cited references, and the Office Actions therein, Not yet published, Ernst et al.

Angeles, Jorge, et al., "The Online Solution of the Hand-Eye Problem", IEEE Transactions on Robotics and Automation, 16(6): 720-731 (Dec. 2000).

Chou, Jack C. K., et al., "Finding the Position and Orientation of a Sensor on a Robot Manipulator Using Quaternions", The International Journal of Robotics Research, 10(3): 240-254 (Jun. 1991).

Horn, Berthold K. P., "Closed-form solution of absolute orientation using unit quaternions", Journal of the Optical Society of America, vol. 4, p. 629-642 (Apr. 1987).

Kiruluta, Andrew, et al., "Predictive Head Movement Tracking Using a Kalman Filter", IEEE Trans. on Systems, Man, and Cybernetics—Part B: Cybernetics, 27(2):326-331 (Apr. 1997).

Park, Frank C. and Martin, Bryan J., "Robot Sensor Calibration: Solving AX-XB on the Euclidean Group", IEEE Transaction on Robotics and Automation, 10(5): 717-721 (Oct. 1994).

Shiu, Yiu Cheung, and Ahmad, Shaheen, "Calibration of Wrist-Mounted Robotic Sensors by Solving Homogeneous Transform Equations of the Form AX=XB", IEEE Transactions on Robotics and Automation, 5(1): 16-29 (Feb. 1989).

Tremblay, Marleine, et al., "Retrospective Coregistration of Functional Magnetic Resonance Imaging Data using External monitoring", Magnetic Resonance in Medicine 53:141-149 (2005).

Tsai, Roger Y. and Lenz, Reimer K., "A New Technique for Fully Autonomous and Efficient 3D Robotics Hand/Eye Calibration", IEEE Transaction on Robotics and Automation, 5(3): 345-358 (Jun. 1989).

Wang, Ching-Cheng, "Extrinsic Calibration of a Vision Sensor Mounted on a Robot", IEEE Transactions on Robotics and Automation, 8(2):161-175 (Apr. 1992).

Zaitsev, M., et al., "Prospective Real-Time Slice-by-Slice 3D Motion Correction for EPI Using an External Optical Motion Tracking System", Proc.Intl.Soc.Mag.Reson.Med.11:517(2004).

U.S. Appl. No. 13/831,115 including its prosecution history, the cited references, and the Office Actions therein, Not yet published, Lovberg, John Arthur et al.

Aksoy et al., *Real-Time Optical Motion Correction for Diffusion Tensor Imaging*, Magnetic Resonance in Medicine (Mar. 22, 2011) 66 366-378.

Andrews et al., *Prospective Motion Correction for Magnetic Resonance Spectroscopy Using Single Camera Retro-Grate Reflector Optical Tracking*, Journal of Magnetic Resonance Imaging (Feb. 2011) 33(2): 498-504.

Bandettini et al., *Processing Strategies for Time-Course Data Sets in Functional MRI of the Human Brain*, Magnetic Resonance Medicine (Apr. 15, 1993) 30: 161-173.

Barmet et al, *Spatiotemporal Magnetic Field Monitoring for MR*, Magnetic Resonance in Medicine (Feb. 1, 2008) 60: 187-197.

Bartels et al., *Endovascular interventional magnetic resonance Imaging*, Physics in Medicine and Biology (Jul. 1, 2003) 48: R37-R64.

Ernst et al., *A Novel Phase and Frequency Navigator for Proton Magnetic Resonance Spectroscopy Using Water-Suppression Cycling*, Magnetic Resonance in Medicine (Jan. 2011) 65(1): 13-7.

Eviatar et al., *Real time head motion correction for functional MRI*, In: Proceedings of the International Society for Magnetic Resonance in Medicine (1999) 269.

Forbes et al., *PROPELLER MRI: Clinical Testing of a Novel Technique for Quantification and Compensation of Head Motion*, Journal of Magnetic Resonance Imaging (May 21, 2001) 14:215-222.

Glover et al., *Self-navigated spiral fMRI: interleaved versus single-shot*, Magnetic Resonance in Medicine (Aug. 13, 1997) 39: 361-368.

Herbst et al., Preventing *Signal Dropouts in DWI Using Continous Prospective Motion Correction*, Proc. Intl. Soc. Mag. Reson. Med. 19 (May 2011) 170.

Herbst et al., *Prospective Motion Correction With Continuous Gradient Updates in Diffusion Weighted Imaging*, Magnetic Resonance in Medicine (2012) 67:326-338.

MacLaren et al., *Combined Prospective and Retrospective Motion Correction to Relax Navigator Requirements*, Magnetic Resonance in Medicine (Feb. 11, 2011) 65:1724-1732.

MacLaren et al., *Navigator Accuracy Requirements for Prospective Motion Correction*, Magnetic Resonance in Medicine (Jan. 2010) 63(1): 162-70.

MacLaren, *Prospective Motion Correction in MRI Using Optical Tracking Tape*, Book of Abstracts, ESMRMB (2009).

McVeigh et al., Real-time, *Interactive MRI for Cardiovascular Intervention1*, Academic Radiology (Sep. 2005) 12(9): 1121-1127.

Nehrke et al., *Prospective Correction of Affine Motion for Arbitrary MR Sequences on a Clinical Scanner*, Magnetic Resonance in Medicine (Jun. 28, 2005) 54:1130-1138.

Ooi et al., *Prospective Real-Time Correction for Arbitrary Head Motion Using Active Markers*, Magnetic Resonance in Medicine (Apr. 15, 2009) 62(4): 943-54.

Qin et al., *Prospective Head-Movement Correction for High-Resolution MRI Using an In-Bore Optical Tracking System*, Magnetic Resonance in Medicine (Apr. 13, 2009) 62: 924-934.

(56) References Cited

OTHER PUBLICATIONS

Schulz et al., *First Embedded In-Bore System for Fast Optical Prospective Head Motion-Correction in MRI*, In: Proceedings of the 28th Annual Scientific Meeting of the ESMRMB (Oct. 8, 2011) 369.
Ward et al., *Prospective Multiaxial Motion Correction for fMRI*, Magnetic Resonance in Medicine (Nov. 16, 1999) 43:459-469.
Welch et al., *Spherical Navigator Echoes for Full 3D Rigid Body Motion Measurement in MRI*, Magnetic Resonance in Medicine (Jul. 22, 2001) 47:32-41.
Zeitsev et al., *Magnetic resonance imaging of freely moving objects: Prospective real-time motion correction using an external optical motion tracking system*, NeuroImage 31 (Jan. 29, 2006) 1038-1050.
International Search Report and Written Opinion for Application No. PCT/US2014/013546, dated May 26, 2014, in 14 pages.
International Preliminary Report on Patentability for Application No. PCT/US2014/013546, dated Aug. 4, 2015, in 9 pages.
International Search Report and Written Opinion for Application No. PCT/US2015/022041, dated Jun. 29, 2015, in 9 pages.
Maclaren et al., "Measurement and correction of microscopic head motion during magnetic resonance imaging of the brain", PLOS ONE, vol. 7(11):1-9 (2012).
Josefsson et al. "A flexible high-precision video system for digital recording of motor acts through lightweight reflect markers", Computer Methods and Programs in Biomedicine, vol. 49:111-129 (1996).
Aksoy et al., "Hybrind Prospective and Retrospective Head Motion Correction to Mitigate Cross-Calibration Errors", NIH Publication, Nov. 2012.
Carranza-Herrezuelo et al, "Motion estimation of tagged cardiac magnetic resonance images using variational techniques" Elsevier, Computerized Medical Imaging and Graphics 34 (2010), pp. 514-522.
Cofaru et al "Improved Newton-Raphson digital image correlation method for full-field displacement and strain calculation," Department of Materials Science and Engineering, Ghent University St-Pietersnieuwstraat, Nov. 20, 2010.

\* cited by examiner

METHODS, SYSTEMS, AND DEVICES FOR INTRA-SCAN MOTION CORRECTION

CROSS-REFERENCE TO RELATED APPLICATIONS

This application claims the benefit of U.S. Provisional Application No. 61/527,972, filed Aug. 26, 2011, and titled DYNAMIC ADJUSTMENT OF MAGNETIC FIELD GRADIENTS AND RF PULSES WITHIN MR SEQUENCES, which is hereby incorporated herein by reference in its entirety.

STATEMENT REGARDING FEDERALLY SPONSORED R&D

This invention was made with government support under Grant Number 5R01DA021146 awarded by the National Institutes of Health. The government has certain rights to this invention.

BACKGROUND

Field

This invention relates generally to the field of biomedical imaging, and more specifically to a system for correcting defects in medical images that are caused by a subject's movement during an in vivo (in the living body) magnetic resonance scan.

Description

"Tomographic" imaging techniques generate images of multiple slices of an object. Some commonly used tomographic imaging techniques include magnetic resonance imaging (MRI) and magnetic resonance spectroscopy (MRS) techniques, which are ideal for assessing the structure, physiology, chemistry and function of the living brain and other organs, in vivo and non-invasively. Because the object of interest is often imaged in many scanning steps in order to build a complete two or three dimensional view, scans are of long duration, usually lasting several minutes. To increase resolution (detail) of a tomographic scan, more slices and more scanning steps must be used, which further increases the duration of a scan. Scans may also be of long duration in order to obtain sufficient signal-to-noise ratio. Magnetic resonance techniques (including tomographic techniques), that are currently known or to be developed in the future (hereinafter collectively referred to as "MR" or "MRI") can also afford relatively high spatial and temporal resolution, are non-invasive and repeatable, and may be performed in children and infants. However, due to their duration, MR scans can be subject to the problem of patient or object motion.

SUMMARY

Advancements in magnetic resonance technology make it possible to correct for artifacts in images obtained from magnetic resonance scans which are caused by motion of the subject during the magnetic resonance scan.

In some embodiments, a magnetic resonance system configured to correct intra-scan motion during a magnetic resonance scan comprises: a magnetic resonance scanner configured to generate a magnetic field gradient and a radiofrequency signal for the magnetic resonance scan; a motion tracking system configured to track one or more pose parameters of a subject and transmit pose data corresponding to the tracked one or more pose parameters at a given time to the magnetic resonance scanner; an electronic memory storage configured to store modules; and a computer processor configured to execute the modules comprising at least: a correction gradient calculation module configured to calculate a moment of a correction gradient to apply to the subject, wherein the moment of the correction gradient is calculated based on the transmitted pose data and a gradient sequence used for the magnetic resonance scan; the magnetic resonance scanner further configured to apply the correction gradient to the subject prior to detecting signals emitted from the subject to correct one or more initial errors in magnetic gradient moment due to movement of the subject during the magnetic resonance scan; and the magnetic resonance scanner further configured to detect the signals emitted from the subject for data acquisition.

In certain embodiments, an intra-scan motion correction system comprises: an electronic memory storage configured to store modules; and a computer processor configured to execute the modules comprising at least: a motion tracking module configured to receive pose data of a subject from one or more motion tracking systems during a magnetic resonance scan of the subject; and a correction gradient calculation module configured to calculate a moment of a correction gradient to apply to the subject, wherein the moment of the correction gradient is calculated based on the received pose data and a gradient sequence used for the magnetic resonance scan, and wherein the correction gradient is to be applied to the subject to correct one or more initial errors in magnetic gradient moment due to movement of the subject during the magnetic resonance scan.

In some embodiments, an intra-scan motion correction system comprises: an electronic memory storage configured to store modules; and a computer processor configured to execute the modules comprising at least: a motion tracking module configured to receive pose data of a subject from one or more motion tracking systems over a computer network during a magnetic resonance scan of the subject; and an error correction module configured to calculate a gradient moment based on the received pose data and a gradient sequence used for the magnetic resonance scan, wherein the error correction module is further configured to correct one or more errors in the calculated gradient moment, and wherein the one or more errors in the gradient moment are corrected during reconstruction.

In some embodiments, an intra-scan motion correction system comprises: an electronic memory storage configured to store modules; and a computer processor configured to execute the modules comprising at least: a motion tracking module configured to receive pose data of a subject from one or more motion tracking systems over a computer network during a magnetic resonance scan of the subject; and an error correction module configured to calculate a phase based on the received pose data and a gradient sequence used for the magnetic resonance scan, wherein the error correction module is further configured to correct one or more errors in the phase, and wherein the one or more errors in the phase are corrected during reconstruction.

In some embodiments, a computer-implemented method of correcting for intra-scan motion during a magnetic resonance scan comprises: generating by a magnetic resonance scanner a magnetic field gradient and a radiofrequency signal for the magnetic resonance scan; tracking by a motion tracking system one or more pose parameters of a subject and transmitting pose data corresponding to the tracked one or more pose parameters at a given time to the magnetic resonance scanner; calculating by a correction gradient calculation module a moment of a correction gradient to apply to the subject, wherein the moment of the correction gradient is calculated based on the transmitted pose data and a gradient sequence used for the magnetic resonance scan; applying by the magnetic resonance scanner the correction gradient to the subject prior to detecting signals emitted from the subject to correct one or more initial errors in magnetic gradient moment due to movement of the subject during the magnetic resonance scan; and detecting by the magnetic resonance scanner the signals emitted from the subject for data acquisition, wherein the computer comprises a computer processor and an electronic storage medium.

In certain embodiments, a computer-implemented method of correcting for intra-scan motion during a magnetic resonance scan comprises: receiving by a motion tracking module pose data of a subject from one or more motion tracking systems during the magnetic resonance scan of the subject; and calculating by a correction gradient calculation module a moment of a correction gradient to apply to the subject, wherein the moment of the correction gradient is calculated based on the received pose data and a gradient sequence used for the magnetic resonance scan, and wherein the correction gradient is to be applied to the subject to correct one or more initial errors in magnetic gradient moment due to movement of the subject during the magnetic resonance scan, wherein the computer comprises a computer processor and an electronic storage medium.

In some embodiments, a computer-implemented method of correcting for intra-scan motion during a magnetic resonance scan comprises: receiving by a motion tracking module pose data of a subject from one or more motion tracking systems over a computer network during a magnetic resonance scan of the subject; and calculating by an error correction module a gradient moment based on the received pose data and a gradient sequence used for the magnetic resonance scan, wherein the error correction module is further configured to correct one or more errors in the calculated gradient moment, and wherein the one or more errors in the gradient moment are corrected during reconstruction, wherein the computer comprises a computer processor and an electronic storage medium.

In some embodiments, a computer-implemented method of correcting for intra-scan motion during a magnetic resonance scan comprises: receiving by a motion tracking module pose data of a subject from one or more motion tracking systems over a computer network during a magnetic resonance scan of the subject; and calculating by an error correction module a phase based on the received pose data and a gradient sequence used for the magnetic resonance scan, wherein the error correction module is further configured to correct one or more errors in the phase, and wherein the one or more errors in the phase are corrected during reconstruction, wherein the computer comprises a computer processor and an electronic storage medium.

In some embodiments, a computer-readable, non-transitory storage medium has a computer program stored thereon for causing a suitably programmed computer system to process by one or more computer processors computer-program code by performing a method to correct for intra-scan motion during a magnetic resonance scan when the computer program is executed on the suitably programmed computer system, wherein the method comprises: generating by a magnetic resonance scanner a magnetic field gradient and a radiofrequency signal for the magnetic resonance scan; tracking by a motion tracking system one or more pose parameters of a subject and transmitting pose data corresponding to the tracked one or more pose parameters at a given time to the magnetic resonance scanner; calculating by a correction gradient calculation module a moment of a correction gradient to apply to the subject, wherein the moment of the correction gradient is calculated based on the transmitted pose data and a gradient sequence used for the magnetic resonance scan; applying by the magnetic resonance scanner the correction gradient to the subject prior to detecting signals emitted from the subject to correct one or more initial errors in magnetic gradient moment due to movement of the subject during the magnetic resonance scan; and detecting by the magnetic resonance scanner the signals emitted from the subject for data acquisition, wherein the computer comprises a computer processor and an electronic storage medium.

In certain embodiments, a computer-readable, non-transitory storage medium has a computer program stored thereon for causing a suitably programmed computer system to process by one or more computer processors computer-program code by performing a method to correct for intra-scan motion during a magnetic resonance scan when the computer program is executed on the suitably programmed computer system, wherein the method comprises: receiving by a motion tracking module pose data of a subject from one or more motion tracking systems during the magnetic resonance scan of the subject; and calculating by a correction gradient calculation module a moment of a correction gradient to apply to the subject, wherein the moment of the correction gradient is calculated based on the received pose data and a gradient sequence used for the magnetic resonance scan, and wherein the correction gradient is to be applied to the subject to correct one or more initial errors in magnetic gradient moment due to movement of the subject during the magnetic resonance scan, wherein the computer comprises a computer processor and an electronic storage medium.

In some embodiments, a computer-readable, non-transitory storage medium has a computer program stored thereon for causing a suitably programmed computer system to process by one or more computer processors computer-program code by performing a method to correct for intra-scan motion during a magnetic resonance scan when the computer program is executed on the suitably programmed computer system, wherein the method comprises: receiving by a motion tracking module pose data of a subject from one or more motion tracking systems over a computer network during a magnetic resonance scan of the subject; and calculating by an error correction module a gradient moment based on the received pose data and a gradient sequence used for the magnetic resonance scan, wherein the error correction module is further configured to correct one or more errors in the calculated gradient moment, and wherein the one or more errors in the gradient moment are corrected during reconstruction, wherein the computer comprises a computer processor and an electronic storage medium.

In some embodiments, a computer-readable, non-transitory storage medium has a computer program stored thereon for causing a suitably programmed computer system to process by one or more computer processors computer-program code by performing a method to correct for intra-scan motion during a magnetic resonance scan when the computer program is executed on the suitably programmed computer system, wherein the method comprises: receiving by a motion tracking module pose data of a subject from one or more motion tracking systems over a computer network during a magnetic resonance scan of the subject; and calculating by an error correction module a phase based on the received pose data and a gradient sequence used for the magnetic resonance scan, wherein the error correction module is further configured to correct one or more errors in the phase, and wherein the one or more errors in the phase are corrected during reconstruction, wherein the computer comprises a computer processor and an electronic storage medium.

For purposes of this summary, certain aspects, advantages, and novel features of the invention are described herein. It is to be understood that not necessarily all such advantages may be achieved in accordance with any particular embodiment of the invention. Thus, for example, those skilled in the art will recognize that the invention may be embodied or carried out in a manner that achieves one advantage or group of advantages as taught herein without necessarily achieving other advantages as may be taught or suggested herein.

BRIEF DESCRIPTION OF THE DRAWINGS

The foregoing and other features, aspects and advantages of the present invention are described in detail below with reference to the drawings of various embodiments, which are intended to illustrate and not to limit the invention. The drawings comprise the following figures in which.

DETAILED DESCRIPTION

Figure 1B:
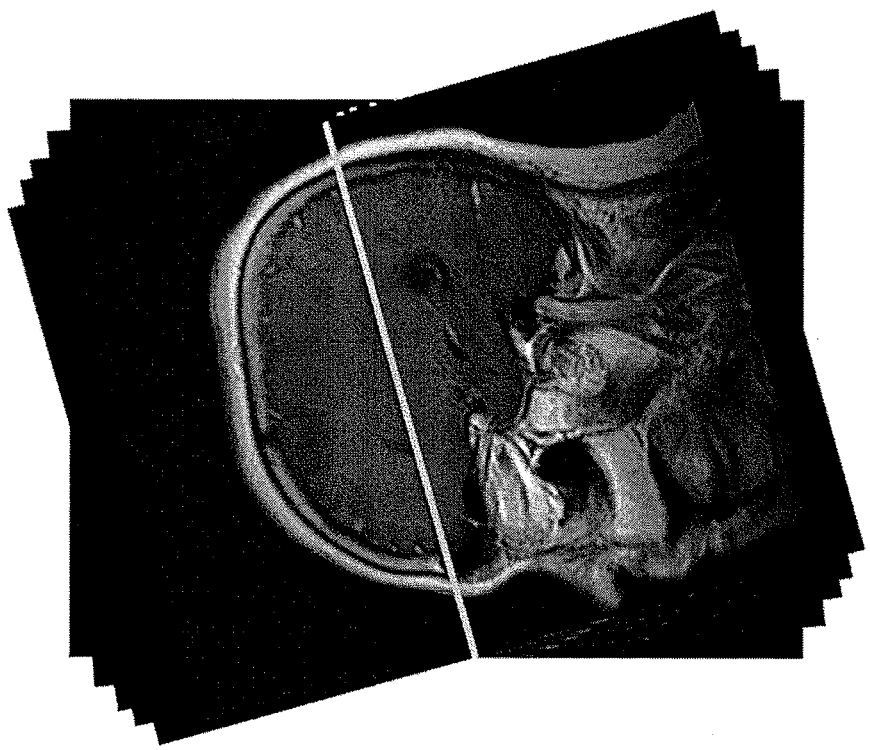
FIG. 1B depicts an example illustrating the effects of motion of a subject during a magnetic resonance scan by an adaptive MRI system.

Embodiments of the invention will now be described with reference to the accompanying figures. The terminology used in the description presented herein is not intended to be interpreted in any limited or restrictive manner, simply because it is being utilized in conjunction with a detailed description of certain specific embodiments of the invention. Furthermore, embodiments of the invention may comprise several novel features, no single one of which is solely responsible for its desirable attributes or which is essential to practicing the inventions herein described.

The disclosure herein provides methods, systems, and devices for intra-scan motion correction during a magnetic resonance (MR) scan.

As used herein, the terms "magnetic resonance techniques," "magnetic resonance imaging," "magnetic resonance scan," "MR techniques," "MR imaging," "MR scan" are broad interchangeable terms, and comprise without limitation magnetic resonance scan, magnetic resonance imaging, functional magnetic resonance imaging, diffusion magnetic resonance imaging, magnetic resonance tomographic techniques, magnetic resonance spectroscopy, other magnetic resonance-based techniques currently existing or to be developed in the future, and/or combinations thereof.

Further, as used herein, the terms "intra-scan motion correction," "intra-sequence motion correction," "continuous intra-scan motion correction," "substantially continuous intra-scan motion correction," "nearly continuous intra-scan motion correction," "repeated intra-scan motion correction," "rapidly repeated intra-scan motion correction," and "quasi-continuous intra-scan motion correction" are broad interchangeable terms, and comprise without limitation single, one or more, continuous, quasi-continuous, substantially continuous, nearly continuous, repeated corrections or the like for one or more errors due to motion of a subject during a magnetic resonance scan, wherein the corrections are applied during the magnetic resonance scan for any magnetic resonance techniques. In addition, as used herein, the terms "real time," "near real time," and "substantially real time" are broad interchangeable terms, and comprise without limitation real time, near real time, or substantially real time periods with minimal delay or lag, for example instantaneously, within 20-30 milliseconds, and/or within 2-3 seconds or longer.

Because certain magnetic resonance techniques require that so many measurements be taken (because so many slices and/or scanning steps are necessary), MR scans typically have a long duration, so that motion of the subject is a substantial problem for acquiring accurate data. Consequently, subjects commonly are required to lie still to within one millimeter and one degree (better than the image resolution) over extended time periods. These strict requirements cannot be met by many subjects in special populations, such as children and infants, patients with stroke, head trauma, dementia, very sick patients, subjects who are agitated or delirious perhaps due to anxiety or drug use, animals, or patients with movement disorders, resulting in data with motion artifacts. As a result, in order to perform an MR scan in such subjects, anesthesia can be required. However, anesthesia can cost about $900 and also has roughly 1/250,000 risk of death.

Further, many tomographic imaging techniques rely on detecting very small percentage changes in a particular type of signal, which makes these techniques even more susceptible to movement. In functional magnetic resonance imaging, for example, changes in the properties of blood in brain areas activated while subjects are performing tasks causes small signal changes (on the order of a few percent) that can be detected with MR. However, these small signal changes may easily be obscured by signal changes of similar or even greater size that occur during unintentional subject movements.

The basic problem is that it may take several minutes for a scan to be completed, but the patient or other object being scanned cannot remain sufficiently still for several minutes. Further, the space for a patient or other object being scanned (the "scanning volume") in an MR machine is very limited—there is very little space in an MR machine once a patient has been positioned inside for a scan. The motion during the scan of a single dataset (e.g. spectrum, 2D-slice, multiple slices or 3D-volume) causes the single acquisition steps to become inconsistent. Since the resulting data are reconstructed from many acquisition steps, this inconsistency can lead to significant data errors, called motion artifacts.

For example, at any given hospital or medical facility, 1 out of every 25 brain examinations can be lost entirely and 1 out of 2 examinations can require at least one repeat scan. The total economic loss to hospital in the U.S. due to such motion artifacts is estimated to be roughly 1.5 million hours per year or $1 billion annually at $750 per hour.

However, by implementing one or more methods, systems, and devices for intra-scan motion correction as described herein, subjects of a magnetic resonance scan are not required to lie still. Rather, because the methods, systems, and devices for intra-scan motion correction as described herein are able to account for movements in subjects of varying degrees and speed, substantially any movement by a subject during a magnetic resonance scan. In some embodiments, substantially any movement by a subject that can be approximated by a local rigid body motion and/or nearly rigid body motion in the area or object of interest can be accounted for. In certain embodiments, any motion of a subject or within a subject that can be described by a motion path that can be approximated by a rigid body can be take into account.

In some embodiments, the methods, systems, and devices for intra-scan motion correction can allow for magnetic resonance scan techniques, whether existing now or to be developed in the future, to be applied to many subjects, including those in special populations, such as children, infants, very sick patients, subjects who are agitated perhaps due to anxiety or drug use, or patients with movement disorders. In addition, effects of movements of certain objects located within a subject, such as internal organs of a subject, fetus, or the like, can also be corrected for in certain embodiments. Further animals may also be subjected to a magnetic resonance scan by implementing one or more methods, systems, and devices for intra-scan motion correction as described herein. Additionally, inanimate objects that move, including flowing liquids or gases, may also be subjected to a magnetic resonance scan by implementing one or more methods, systems, and devices for intra-scan motion correction as described herein. In addition, the methods, systems, and devices for intra-scan motion correction can substantially reduce the economic loss described above due to motion artifacts.

In addition, in some embodiments, the methods, systems, and devices for intra-scan motion correction as described herein do not require that gradients track the rotation of the object of interest as other certain embodiments do or attempt to do. Rather, in some embodiments of the methods, systems, and devices for intra-scan motion correction as described herein, gradient rotations are specifically not updated within a single scan (between excitation and data acquisition). In other words, gradients remain stationary and do not track the motion of the subject to be scanned in some embodiments. The result is that at the end of the sequence, the Bloch equations governing magnetic resonance are not satisfied in some situations, which can introduce an error in the gradient moment. Some embodiments of the methods, systems, and devices for intra-scan motion correction as described herein can unexpectedly eliminate such error in the gradient moment by applying a single, brief, correction gradient of proper gradient moment prior to data acquisition.

Further, in general, subject movement can comprise rotations and/or translations. Rotation matrices can be non-linear, due to the presence of sine and cosine terms. Therefore, if the Bloch equations are violated in some embodiments by not having gradients track subject movement, one might expect that the resulting phase errors become "non-linear" in space, and consequently cannot be corrected using linearly varying gradients. However, theoretical analysis demonstrates that one can use linear gradients to correct the resulting. Accordingly, in some embodiments, the methods, systems, and devices for intra-scan motion correction as described herein can correct for motion artifacts not only due to translations, but also due to small and/or large rotations without having gradients track subject movement.

Moreover, some embodiments of the methods, systems, and devices for intra-scan motion correction as described herein can be simple and not require a substantial amount of data processing. For example, in some embodiments, only one or more additional processes are required in addition to a general magnetic resonance scan process in order to correct for subject motion during the magnetic resonance scan. Accordingly, implementation of some embodiments of the methods, systems, and devices for intra-scan motion correction as described herein can be relatively easy and can be implemented in conjunction any and/or all existing magnetic resonance scan equipment and/or those to be developed in the future. Accordingly, the methods, systems, and devices for intra-scan motion correction as described herein can provide an unexpectedly simple yet accurate correction for any and/or all types of subject motion during a magnetic resonance scan.

Reducing Sensitivity of Scans to Motions of Subject

In some embodiments, specially designed scan sequences can be utilized to minimize the effects of constant motion during a single acquisition step without relevant organ shift during the entire acquisition. For example, a first order flow compensation can be utilized. While such embodiments are particularly useful for reducing artifacts or imaging errors due to flowing blood they are not particularly useful in correcting movements of entire organs, such as head movements.

In other embodiments, improved sampling schemes for the magnetic resonance data can be used to reduce sensitivity to motion. Such embodiments can reduce motion sensitivity of magnetic resonance scans under certain conditions. However, they are not particularly useful in correcting motions under other conditions or for very quick movements. Further such embodiments can require redundant measurements to encode additional information required for correction and thus reduce sampling efficiency. Such embodiments are also not generally applicable to all measurement techniques.

In certain embodiments, certain ultra-fast single shot imaging techniques can be utilized to account for movement by a subject during a magnetic resonance scan. For example, echo planar imaging, spiral imaging, or imaging using other fast trajectories can be utilized. In such embodiments the entire organ of interest, such as a brain, is scanned continuously every few seconds over the course of minutes, for instance, for functional magnetic resonance imaging, diffusion imaging, perfusion imaging, or other modalities. By doing so, such embodiments make it possible to determine the pose defined as a position and rotation, for example of the head or other subject at each instant relative to the initial pose, using image-based registration and/or alignment of images. More specifically, once the pose for a given instant is known relative to the initial image, the magnetic resonance scanner's image for that instant can be realigned to the initial image. Further, realignment of magnetic resonance imaging volumes comprising multiple slices can be used to correct for head motion and functional magnetic resonance imaging time series. However, such embodiments are inherently slow because they use magnetic resonance imaging and may be unable to correct for motion in certain directions, such as orthogonal to the scan planes or towards or away from the planes in which the scans are being taken. Also, such embodiments correct movements only every few seconds (for each volume).

Motion Correction Methods

The embodiments for reducing sensitivity of scans to motions of a subject described above, however, are rather limited. One major problem is related to the manner in which typical tomographic imaging methods acquire data. Specifically the data for each cross section or slice is acquired by moving step by step along lines in a mathematical space, also known as k-space. This data acquisition step is typically repeated hundreds of times in a magnetic resonance imaging scan, until all lines in the k-space have been filled. For three dimensional imaging, thousands of such steps are required to acquire an entire volume. The various embodiments of reducing sensitivity of scans to subject motion, however, typically do not account for variations in the subject's pose amongst the different k-space lines, even though motion sensitivity for each individual acquisition or a line in k-space is reduced. Further, the various embodiments of reducing sensitivity of scans to motions of a subject rather poorly tolerate fast or irregular movements within individual acquisition steps.

Accordingly, in some embodiments, the pose of the subject of the scan and motion is tracked near-real time, during a scan. For example, the subject can be a head, brain, or other organ of interest or other object. The pose information that is tracked can be used to compensate for the detected motion in data acquisitions for subsequent acquisition steps or slices or volumes within the same scan. Such embodiments can be denoted "prospective motion correction" because the acquisition steps are adapted prospectively during the scan to compensate for the motion detected.

One important aspect of such embodiments of adapting imaging by prospective motion correction is the accuracy or resolution of the motion tracking system. Because of the high resolution generally required for biomedical imaging, the motion tracking system in such embodiments must also have a high resolution, because the motion tracking system's information will be used to align the various acquisition steps. Accordingly, if the motion tracking system's resolution is high enough, all of the acquisition steps can be accurately aligned or registered despite a subject's motion. Conversely, if the motion tracking system's resolution is not high enough, the acquisition steps will not be accurately aligned or registered.

In some embodiments of adapting imaging by prospective motion correction magnetic resonance "navigator" signals can be utilized to estimate the pose of the subject and to dynamically correct for the subject's motion. Further, a magnetic resonance based navigator can also be utilized for adaptive motion correction in magnetic resonance imaging. In other embodiments, small radiofrequency coils can be utilized to track catheters during interventional magnetic resonance imaging.

While such embodiments of magnetic resonance based adaptive magnetic resonance imaging techniques provide good or satisfactory results in many situations, they intrinsically interfere with the magnetic resonance acquisition process. Further, such embodiments can work only for a limited number of magnetic resonance sequences and can be limited to measuring the position or pose of a subject a few times per second at best.

Accordingly, in some embodiments, external or non-magnetic resonance based techniques can be utilized to track subject motion rather than magnetic resonance based methods. For example, one or more optical methods can be utilized. In some embodiments, the pose information from the tracking system can be sent to the magnetic resonance scanner and be used by the scanner to compensate for the motion in subsequent acquisition steps.

In some embodiments, stereovision can be utilized to track the motion of a subject, for example by using two or more cameras and multiple, at least two markers. In other embodiments, accurate tracking of the subject, for example the head or brain or other organ, can be achieved using a single camera and a special marker in the magnetic resonance environment. For example, the special marker can be a self-encoded marker, a retrograde reflector or RGR or Moiré Phase Tracking target. Optical systems can provide accurate, non-contact sensing with a passive and non-magnetic target and can also provide fast pose updates on the order of 100 to 1,000 poses per second or even faster.

In some embodiments pose data from the tracking system are sent in near real time to a magnetic resonance scanner, which then nearly continuously updates scan parameters prior to each acquisition step or line in k-space. This way, the scan planes are locked relative to the moving object of interest. Images acquired with such embodiments of prospective motion correction can show substantially reduced motion artifacts compared to images acquired without motion correction.

However, in some situations pose data as received by the magnetic resonance scanner may be imperfect, for example due to inaccuracies or noise in the tracking system or due to lag times between the marker movement and arrival of tracking data on the scanner. In order to correct for such inaccuracies or delays, some of these inaccuracies or delays can be determined after the magnetic resonance scan has been acquired in certain embodiments as the entire tracking data are then available. More specifically, when prospective motion correction is applied, subject motion between the pose detection and magnetic resonance data acquisition can occur due to the time required to acquire and transfer marker images to the tracking computer, calculate pose information, perform magnetic resonance sequence updates, and the intrinsic timing of the sequence. Accordingly, differences between the assumed or estimated pose and the true pose during the acquisition step may cause residual motion artifacts. Similarly, inaccuracies in the tracking system, such as tracking noise, can cause errors. However, in certain embodiments some of these effects of tracking errors on magnetic resonance signals can be corrected retrospectively within the data reconstruction by comparing the estimated or assumed pose from the tracking system and the true pose that is available after the acquisition step.

The shortcomings of such embodiments of non-magnetic resonance correction methods and others, however, are related to the fact that such embodiments use updates of scan parameters once prior to each magnetic resonance acquisition step or line in k-space. In fact, magnetic resonance acquisitions involve a sequence of events. For example, a common sequence involves excitation of the spin system using one or more radiofrequency pulses, possibly slice selective, spatial encoding using spatially variable switched magnetic fields (gradients), possible further manipulations of the spin system such as rephasing and complementary information encoding steps, and data acquisition. For some sequences, excitation may be preceded by an extra module to prepare the spin system to achieve a certain contrast. As a result, acquisition of a single k-space line may last a few milliseconds to several hundred milliseconds. However, pose updates for prospective motion correction embodiments above have been applied immediately prior to excitation for each individual magnetic resonance acquisition or k-space line. Consequently, pose updates may be applied approximately ten times per second, even if the tracking system is capable of tracking at a higher rate, for example at 100 poses per second.

The scheme described above of updating scan parameters once per individual acquisition step or k-space line can provide adequate motion correction if the object of interest does not move too fast. However, if the motion of the subject within an individual acquisition step becomes too fast, then additional motion artifacts may be generated in the resulting images, which cannot be corrected with once per acquisition pose updates. Such motion can be denoted "intra-scan motion."

Accordingly, in some embodiments, motion artifacts due to substantial intra-scan motion can be eliminated or attenuated by attempting to nearly continuously update magnetic field gradients and radiofrequency pulses during each acquisition. This way their orientation is perfectly aligned with the moving object of interest at any time. For example, such an embodiment can be implemented for diffusion-weighted magnetic resonance imaging, which involves very strong magnetic field gradients and is particularly sensitive to subject motion. In certain embodiments, a single magnetic resonance acquisition step, which typically involves a single sequence block of approximately 100 milliseconds for its application, can be broken down into multiple separate blocks, each lasting approximately two milliseconds. The direction of gradients for each of these two millisecond blocks can be updated using the most recent tracking data, resulting in a quasi-continuous pose update during the acquisition.

Despite the features of embodiments of quasi-continuously updating parameters during each acquisition as described above, implementation of such a quasi-continuous pose date scheme is extremely challenging and may not be possible on all available magnetic resonance scanner platforms. In addition, an ideal implementation of such embodiments of quasi-continuous correction methods during each acquisition would necessarily require that updates are made continuously. In contrast, current magnetic resonance scanners cannot update gradient orientations continuously. As such, pose updates can be applied only quasi-continuously, for example every two milliseconds. Consequently, it would be advantageous to have a simpler scheme to correct for intra-scan movements that does not rely on ideally continuous updates of measurement parameters.

Intra-Scan Motion Correction—Introduction

Figure 1A:
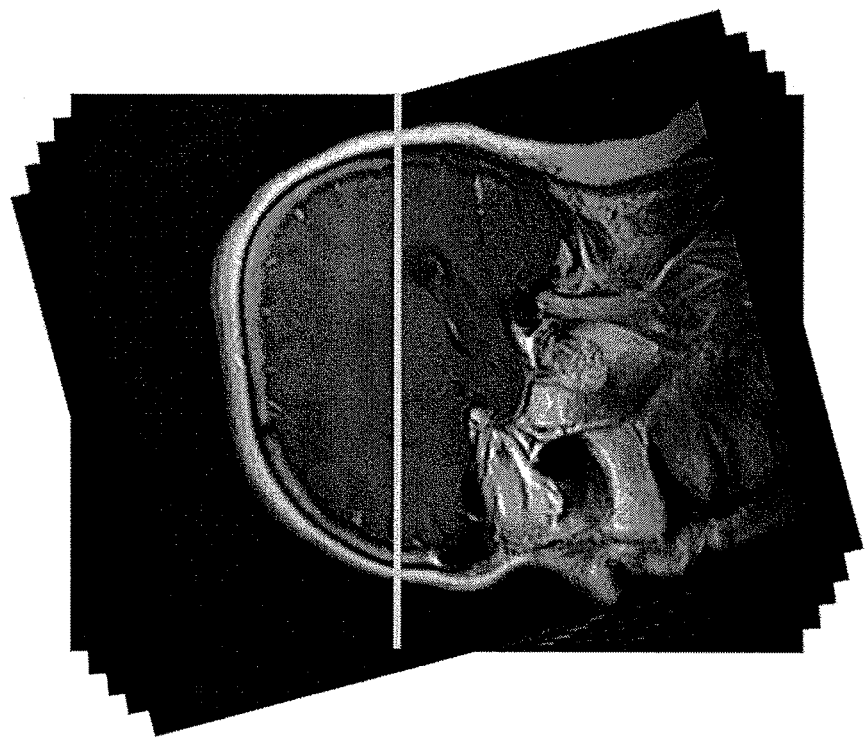
FIG. 1A depicts an example illustrating the effects of motion of a subject during a magnetic resonance scan by a conventional MRI system.

As generally described above, movement by a subject during a magnetic resonance scan can present significant problems in obtaining clear images of the subject. The effects of motion of a subject during a magnetic resonance scan are illustrated in FIGS. 1A and 1B. FIG. 1A illustrates the effects of a subject's motion during a magnetic resonance scan by a conventional magnetic resonance scanner. As illustrated in FIG. 1A, if a subject of a magnetic resonance imaging scan, such as a head, is titled to a certain degree, the resulting slice or image from that scan, which is stationary, inevitably becomes tilted relative to the subject as well. Such movement by the subject during a scan can result in blurry and/or unclear images. As a result, the acquired magnetic resonance scan may not be useful to a medical professional or the subject may be required to redo the entire magnetic resonance scan, resulting in an unnecessary burden in time and cost.

However, by utilizing one or more intra-scan motion correction methods described herein, the geometry and/or phase of a signal can be updated periodically and/or prospectively during a scan to substantially match the motion of the subject. FIG. 1B illustrates the effects of a motion of a subject during a magnetic resonance scan by an intra-scan motion correction system. As illustrated in FIG. 1B, as the subject, or head in this example, is tilted or moved, the slice plane of the magnetic resonance scanner and/or phase and/or read orientations can also be tilted and/or adjusted to account for the motion of the subject. This way, any or substantially all of the subject's movement can be accounted for, resulting in a clean image that is substantially similar to an image that would have been acquired if the subject had not moved at all. Accordingly, by utilizing one or more methods, systems, and devices for an intra-scan motion correction as described herein, a subject of a magnetic resonance imaging scan can be allowed to move with attenuated and/or without any such detrimental effects to the imaging results.

In general, slow motions of a subject during a magnetic resonance scan can be defined as movements with speeds of about 1 mm/sec or 1 degrees/sec. Such slow motions can comprise slow drifts and can be nearly imperceptible. Moderate motions of a subject during a magnetic resonance scan can be defined as movements with speeds of about 10 mm/sec or 10 degrees/sec. Such moderate motions are perceptible and can be common in children and sick or confused patients. Fast motions of a subject during a magnetic resonance scan can be defined as movements with speeds of about 100 mm/sec or 100 degrees/sec or faster. Such fast motions can occur due to coughing or extreme agitation and can be limited in range and duration, for example 100 ms, due to confined space.

In some embodiments of methods, systems, and devices for intra-scan motion correction as described herein, motion artifacts arising from slow and moderate motions can be accounted for. In certain embodiments of methods, systems, and devices for intra-scan motion correction as described herein, even motion artifacts arising from fast motions can also be accounted for.

In general, some effects of motion on moving spins can comprise unwanted phase shifts between excitation and signal readout, unwanted pose changes between phase-encoding steps (or lines in k-space), and uncorrected pose changes between successive slices or volumes. Uncorrected pose changes between successive slices or volumes can occur in ultra-fast acquisitions that image the entire subject or brain every few seconds. Such volumes can be translated and rotated. Unwanted pose changes between phase encoding steps can result in blurring; in other words, the object of interest can be imaged at variable poses. Lastly, unwanted phase shifts between excitation and signal readout can result in artifacts in the phase-encoding direction after image reconstruction. The unwanted pose changes and uncorrected pose changes are purely geometric and thus can relatively easily be corrected. However, correcting phase shifts can be more complicated.

Generally, the magnetic resonance scanner detects the sum of magnetization of the individual spins in a given volume. The sum of signals from all individual spins is detected. In order for the magnetic resonance signal to be detectable, phases of individual spins need to be coherent or aligned. Loss of phase coherence of spins can cause signal attenuation or loss. In order to ensure phase coherence during signal detection, gradients have to be balanced throughout a pulse sequence, because gradients affect a spin's frequency and phase dependent on the spin's spatial position. Furthermore, the phase of the signals detected has to be aligned across acquisition steps or lines in k-space. However, motion interferes with this process by inducing unintended phase shifts. Accordingly, motion artifacts caused by phase shifts can be corrected if the phase shifts can be accounted for.

In order to account for a subject's motion during a magnetic resonance scan the motion of the object of interest can first be characterized mathematically. The object of interest can be assumed for example to be a rigid body. Mathematically, the pose of the object can be characterized by six time dependent parameters, three translations and three rotations. In other words, a pose of an object can be considered to comprise six degrees of freedom. In contrast, orientation of an object can comprise two or more degrees of freedom, three or more degrees of freedom, four or more degrees of freedom, or five or more degrees of freedom.

The 3 translations can form a translation vector X(t) and the 3 rotations can form a rotation matrix R(t), where t represents time. The trajectory of a spin (initial vector position $x_0$) inside the imaging volume can then described by the vector equation: $x(t)=X(t)+R(t)\cdot x_0$.

As described above, a magnetic resonance sequence generally involves a series of radiofrequency pulses, switched magnetic field gradients, and one or more acquisition events. For simplicity, a sequence involving a single excitation radiofrequency pulse (at time t=0), followed by a time series of gradients [denoted by vector G(t)] and data acquisition can be considered. Motion within this sequence ("intra-scan motion") alters both the zero-order phase (due to translations) and effective gradient moment M (due to rotations) in the object coordinate system.

Translations X(t) will cause a change in the overall phase φ of the object at the time T of data acquisition, and rotations R(t) will cause a change in the gradient moment M of the object at the time T of data acquisition. It can be shown that the effects of translations and rotations are as follows:

$$M = \int_0^T R^{-1}(t)\cdot G(t)\cdot dt \quad (1)$$

$$\varphi = 2\pi \cdot \gamma \int_0^T X(t)\cdot G(t)\cdot dt \quad (2)$$

where time t=0 denotes excitation of the spin system and γ is the gyromagnetic ratio. For a stationary object (R(t)=1), equation 1 reduces to:

$$M_{stationary} = \int_0^T G(t)\cdot dt = 0$$

which equals zero since magnetic resonance sequences are generally balanced (first gradient moment between excitation and data acquisition is zero). However, time-dependent rotations induce a gradient imbalance (residual gradient moment M as per Eq. 1) that can result in signal attenuation or dropouts in the presence of sufficiently strong motion. Additionally, since gradient moments are used for spatial encoding, motion-dependent alterations in gradient moments can alter the spatial encoding of magnetic resonance signals and cause artifacts during image reconstruction. Likewise, time dependent translations can induce a spatially constant phase as per Eq. 2 that can vary from one acquisition step to another and can lead to artifacts in the reconstructed data.

These phase and gradient moment effects caused by intra-scan motion arise from the interaction between the moving object and switched magnetic field gradients. However, most embodiments of non-continuous motion correction methods consider only geometric effects of motion, such as ensuring that scan planes are aligned correctly during scans (see, for example, FIG. 1B), with the exception of the quasi-continuous embodiment described above. However, the geometric effects and phase/gradient moment effects are conceptually entirely different. For instance, phase effects may occur even if all geometric effects are corrected, and vice versa. Accordingly, in order to accurately correct for movement and/or motion of a subject during a magnetic resonance scan, both geometric effects and phase/gradient moment effects must be accounted for.

Figure 2:
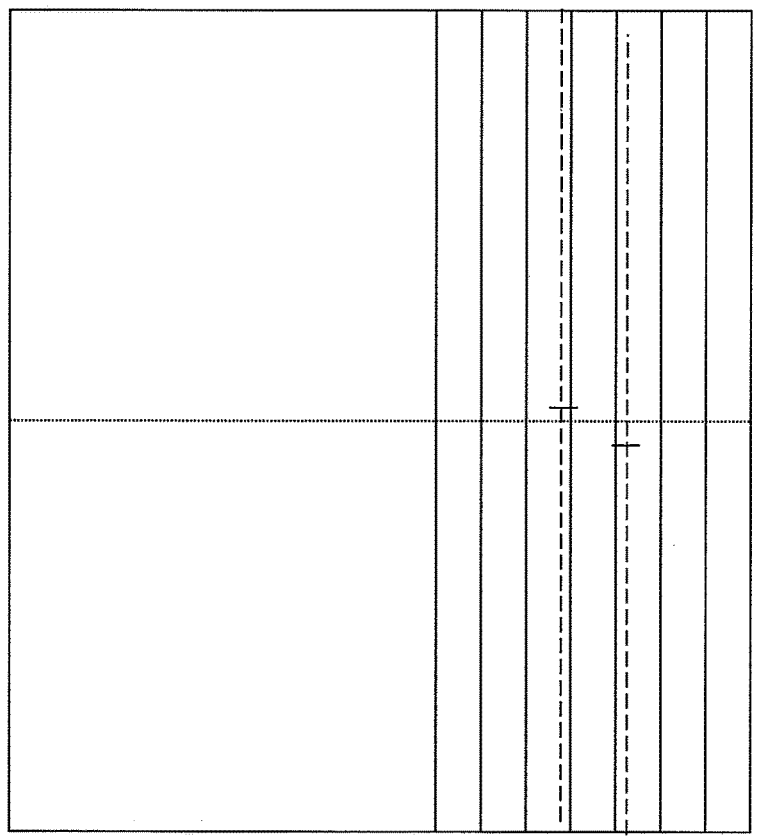
FIG. 2 illustrates the effects of motion of a subject during a magnetic resonance scan in k-space.

FIG. 2 illustrates the phase/gradient movement effects in generating a magnetic resonance image via k-space when the subject moves in orientation and/or pose. When a subject of a magnetic resonance scan remains completely still and does not move, the data acquired from such scan is generally placed in the correct position of k-space which is denoted by the intersection between the center vertical line and one or more solid horizontal lines as depicted in FIG. 2. However, when the subject of a magnetic resonance scan moves, the data acquired cannot be placed in the correct k-space either vertically and/or horizontally. Vertical displacement, or placing an acquired data off of a horizontal parallel line, denotes an error in the phase encoding. Horizontal displacement, or placing an acquired data off of the center vertical line, denotes an error in the read encoding or frequency encoding. In other words, the x axis in k-space is encoded by a read gradient, and the y axis in k-space is encoded by a phase gradient. As such, the phase encoding gradient, or the read encoding gradient, or both the phase encoding gradient and the read encoding gradient must be updated according to the detected motion of the subject in order to account for substantially all motion effects by the subject during the scan. Further, rotations in space generally correspond to rotations in k-space. Therefore, rotations of the subject may be corrected by adjusting phase encoding gradients and/or frequency encoding gradients so that they match the rotation of the subject to be scanned. In some embodiments, translations of the subject can essentially be approximated by phase shifts that vary linearly in k-space and corrected for intra-scan or during image reconstruction.

Intra-Scan Motion Correction—System Overview

As described above because both geometric and phase/gradient movement effects must be accounted for in order to better correct motion of a subject during a magnetic resonance scan, embodiments of the intra-scan motion correction systems, methods, and devices described herein comprise one or more techniques of targeting these effects. Also, embodiments of the intra-scan motion correction systems, devices, and methods described herein generally use less data processing capabilities compared to the quasi-continuous embodiment described above and can be utilized with the majority of currently available magnetic resonance scanners. Additionally, prospective update errors due to the inherent lag time, noise, or the like in the quasi-continuous correction embodiment described above can be eliminated in embodiments of the intra-scan motion correction system, methods, and devices described herein.

Figure 3:
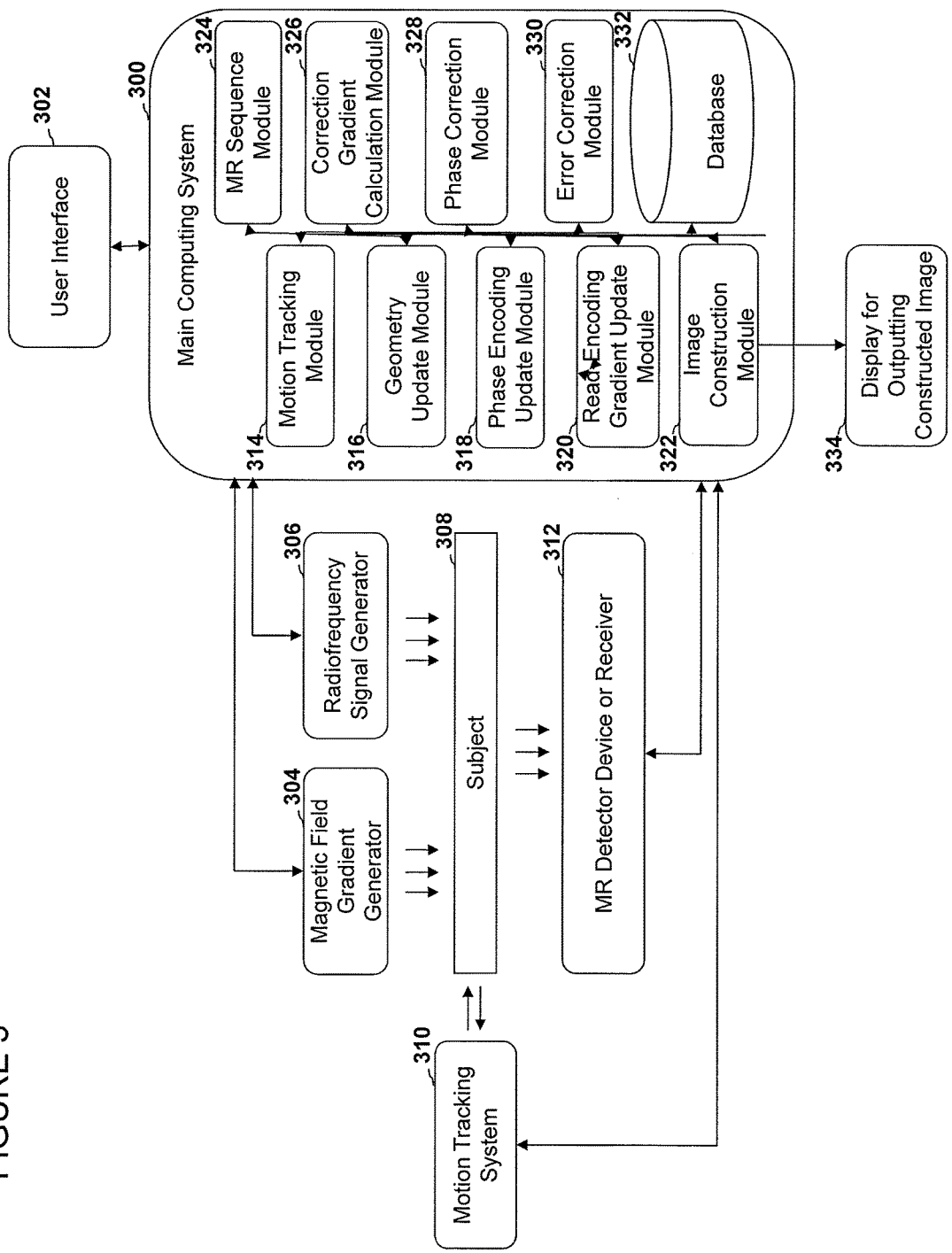
FIG. 3 depicts an example of one embodiment of an intra-scan motion correction system coupled with a magnetic resonance scanner.

FIG. 3 illustrates an embodiment of a system for intra-scan motion correction. An intra-scan motion correction system can be configured to be used in conjunction with one or more magnetic resonance scanners. In some embodiments, a magnetic resonance scanner can comprise an intra-scan motion correction system. In other embodiments, a magnetic resonance scanner and an intra-scan motion correction system are physically separate. In certain embodiments, one or more parts or modules of a magnetic resonance scanner and an intra-scan motion correction system are shared and/or accessible by the other.

As illustrated in FIG. 3, an embodiment of an intra-scan motion correction system can generally comprise a main computing system 300, a user interface 302, and a display for outputting constructed images 334. In some embodiments, the user interface 302 can allow a medical professional and/or other user to control the intra-scan motion correction system and/or magnetic resonance system, such as turning the system on or off and/or controlling one or more parameters of the system. By utilizing the user interface 302, a user can instruct the main computing system 300 to turn a magnetic field gradient 304 on or off by transmitting the instruction from the main computing system 300 to a magnetic field gradient generator 304. In addition a user can use the user interface 302 to instruct the main computing system 300 to turn a radiofrequency signal generator 306 on or off and also control the radiofrequency signal generator 306 to emit a radiofrequency signal of a certain type.

The motion tracking system 310 can track substantially any and all motion of the subject 308 during a magnetic resonance imaging scan. The motion tracking system 310 can comprise any of the motion tracking systems that are currently known or to be developed in the future. For example, the motion tracking system 310 can be an optical or stereovision system (in-bore or out-bore), optical system with multiple cameras (in-bore or out-bore), laser-based tracking system with or without a reflector (in-bore or out-bore), radiofrequency pickup coils-based system (in-bore), magnetic field gradient monitoring system (in-bore), wire loop recordings-based system (for example, using EEG equipment), self-encoded marker-based system, single camera-based system (in-bore or out-bore), mechanical detection system, magnetic field gradient monitoring-based system, ultrasound-based system, or the like. After the motion tracking system 310 tracks the motion of the subject 308, the tracking data can be transmitted from the motion tracking system 310 to the main computing system 300. In some embodiments, the motion tracking system 310 is configured to track and/or send data related to the motion of the subject 308 in real time.

In some embodiments the motion tracking data that is collected by the motion tracking system 310 is transmitted to the main computing system 300 over a computer network periodically in packets of data. In other embodiments the motion tracking data collected by the motion tracking system 310 is transmitted over a computer network to the main computing system 300 at once in a relatively large data packet.

The magnetic field gradient and/or radiofrequency signals that are generated by the magnetic field gradient generator 304 and radiofrequency signal generator 306 respectively can affect the magnetization of one or more nuclei of the subject 308. By manipulating the magnetic field gradient and radiofrequency signal, such generated magnetization can be further manipulated in the subject 308, resulting in a signal emission from the subject 308. The emitted signal can be detected by one or more magnetic resonance detector devices and/or receivers 312. Such detected data by the magnetic resonance detector device and/or receiver can be transmitted over a computer network or another connection to the main computing system 300.

The data transmitted from the motion tracking system 310 to the main computing system 300 can be further processed by the motion tracking module 314. For example, the motion tracking module 314 can be configured to generate a motion trajectory of the subject 308. Any such motion data that is transmitted from the motion tracking system 310 and/or motion data that is further processed by the motion tracking module 314 can be stored in a database 332 of the main computing system 300.

Based on the detected motion data by the motion tracking system 310, a geometry update module 316 can be configured to update and/or adjust one or more geometric parameters accordingly in order to compensate for the subject's motion. Any or all geometric parameter updates by the geometry update module 316 can further be stored in the database 332 of the main computing system 300.

Further, based on the detected motion data by the motion tracking system 310, a phase encoding update module 318 can be configured to update one or more phase encoding gradients. The phase encoding gradient updates that are processed by the phase encoding update module 318 can further be stored in the database 332 of the main computing system 300.

In addition, a read encoding gradient update module 320 can be configured to update one or more read encoding gradients based on the motion of the subject 308 as detected by the motion tracking system 310. The read encoding gradient updates that are processed by the read encoding update module 320 can further be stored in the database 332 of the main computing system 300.

The main computing system 300 can further comprise a magnetic resonance sequence module 324. The magnetic resonance sequence module 324 can be configured to process a particular magnetic resonance sequence or a series thereof for one or more magnetic resonance scans. The processed magnetic resonance sequence can be generated by the magnetic field gradient generator and/or radiofrequency signal generator 306 and applied to a subject 308. The magnetic resonance sequence module 324 can further be configured to track or log one or more magnetic resonance sequences, which can then be stored in the database 332 of the main computing system 300.

Further, a correction gradient calculation module 326 of the main computing system 300 can be configured to calculate a first gradient moment during one or more magnetic resonance scans. More specifically, in certain embodiments, the correction gradient calculation module 326 is configured to calculate the (first) gradient moment according to Equation 1 and using the tracked pose and/or orientation data and a gradient signal and/or sequence used during one or more scans. The (first) gradient moment is the time integral of the gradient waveform. In other words, the (first) gradient moment is the area beneath the gradient waveform when plotted against time. In certain embodiments, the gradient waveform can be triangular, trapezoidal, sinusoidal or the like in shape. In other certain embodiments, the gradient waveform may be a superposition of a non-corrected gradient waveform with a triangular, trapezoidal, sinusoidal, waveform or the like in shape. In some embodiments, the only property of the gradient waveform that is required in a method for intra-scan motion correction is the first gradient moment according to Equation 1.

As discussed above, it is a motion-induced alteration in this gradient moment that can cause phase-based motion artifacts in magnetic resonance scans. Accordingly, in some embodiments, a correction gradient or a "blip" gradient can be applied to the subject 308 in order to counteract and/or reverse the effects of the altered first gradient moment. As such, in certain embodiments, the correction gradient calculation module 326 is further configured to determine an appropriate correction gradient moment to be applied to the subject 308. The appropriate correction gradient moment can be equal to the first gradient moment in absolute value but with an opposite sign from the first gradient moment according to Equation 1. In other words, by applying a correction gradient with a moment of −M, motion artifacts caused by a gradient moment of M can be accounted for and the signal phase can be corrected.

In certain embodiments, a correction gradient of a moment as determined by the correction gradient calculation module 326 can be applied to a subject 308 by a magnetic field gradient generator 304. Further, in some embodiments, the (first) gradient moment and/or correction gradient moment that is calculated can be stored in a database 332 of the main computing system 300.

In some embodiments, a phase correction module 328 can be configured to correct errors in one or more constant phases due to subject motion (according to equation 2) prior to data acquisition, during data acquisition, and/or during the reconstruction process of the image. In certain embodiments, the phase correction module 328 is configured to correct errors based on the tracked pose data and/or Equation 2. The phase corrections that are processed by the phase correction module 328 can further be stored in the database 332 of the main computing system 300.

Additionally, the main computing system 300 can also comprise an error correction module 330. The error correction module 330 can be configured to identify and correct any residual errors that remain after data acquisition. For example, the error correction module 330 can be configured to identify and/or correct errors in orientation, pose, and/or phase. In some embodiments, the error correction module 330 can be configured to correct one or more residual errors in one or more geometry parameters and/or signal phase and/or first gradient moment that are present after applying or without applying one or more geometry updates, phase encoding updates, read encoding gradient updates, and/or application of an additional magnetic moment correction gradient. For example, the error correction module 330 can be configured to retrospectively correct errors in one or more geometry parameters, gradient moment, and/or phase.

In certain embodiments, the error correction module 330 can be configured to correct for one or more errors due to lag time in obtaining and processing orientation and/or pose data, noise in data, or the like. For example, due to such lag time and/or noise, errors may exist in one or more geometry updates, phase encoding gradient updates, read encoding gradient updates, and/or calculation of a correction gradient, because all such calculations are based in part on the tracked pose and/or orientation data. Because the true pose and/or orientation data are available after data acquisition or a scan is complete, such discrepancies due to lag time or noise can be resolved. Further, any such residual errors that are corrected by the correction module 330 can further be stored in a database 332 of the main computing system 300.

The main computing system 300 can further comprise an image construction module 322. The image construction module 322 can be configured to construct and/or reconstruct an image based on the one or more signals emitted from the subject 308. In some embodiments, the image construction module 322 can further be configured to construct and/or reconstruct an image based in part on data that is processed by the magnetic resonance imaging sequence module 324, the geometry update module 316, phase encoding update module 318, read encoding gradient update module 320, correction gradient calculation module 326, and/or the correction module 330.

An image that is constructed and/or reconstructed by the image construction module 322 can further be transmitted over a computer network or other connection to one or more displays for outputting a constructed image 334. A user and/or medical professional can view the constructed image via the display for outputting the constructed image 334.

Intra-Scan Motion Correction—Method Overview

Systems, methods, and devices for intra-scan motion correction compensate not only from one line or acquisition step to the next, but also within each acquisition step or line in k-space.

Figure 4:
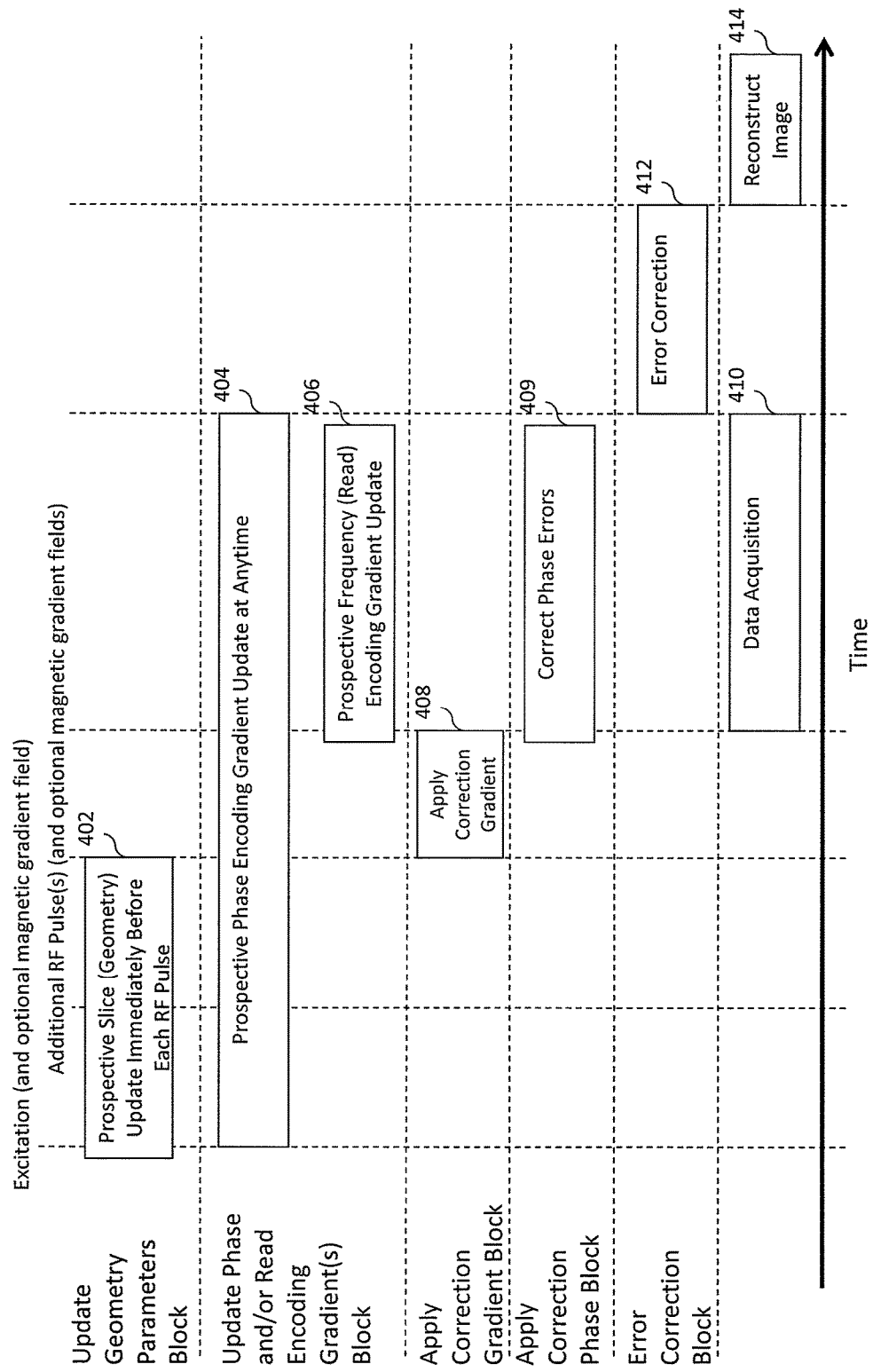
FIG. 4 is a time frame diagram illustrating an example of embodiments of one or more methods of intra-scan motion correction during a magnetic resonance scan.

FIG. 4 is a time frame diagram that illustrates the time frame of one or more methods for an intra-scan motion correction. In some embodiments, a method for an intra-scan motion correction can comprise one or more blocks, including but not limited to an update geometry parameters block, an update phase and/or read encoding gradient(s) block, an apply correction gradient block, and/or an error correction block or any sub-blocks thereof. Additionally, a method for intra-scan motion correction can comprise a phase correction block. Further, a method for intra-scan motion correction can comprise any selective combination of these blocks and/or more specific blocks thereof.

In some embodiments, the update geometry parameters block, update phase and/or read encoding gradient(s) block, apply correction gradient block, and apply phase correction block, can be applied on a magnetic resonance scanner in near real-time. In certain embodiments, the error correction block can be applied after data acquisition during image reconstruction. However, other implementations are possible as well.

In some embodiments, an update geometry parameters block can comprise updating a prospective slice and/or geometry 402. The prospective slice and/or geometry update can occur immediately before one or more radiofrequency pulses. For example, a prospective slice and/or geometry update can occur prior to and/or immediately prior to excitation via an initial radiofrequency pulse. The prospective slice and/or geometry update can also occur prior to and/or immediately prior to an optional initial magnetic gradient field. In addition, a prospective slice and/or geometry update can occur prior to and/or immediately prior to any additional radiofrequency pulses and/or optional magnetic gradient fields. In certain embodiments, there can be one or more additional radiofrequency pulses and/or optional magnetic gradient fields. In other embodiments, there are no additional radiofrequency pulses and/or optional magnetic gradient fields.

In some embodiments an update phase and/or read encoding gradients block can comprise prospectively updating the orientation or pose of a phase encoding gradient and/or a frequency (read) encoding gradient. The prospective phase encoding gradient update can occur at any time between excitation and data acquisition 410. For example in some embodiments, a prospective phase encoding gradient update 404 can occur immediately after excitation and/or an optional magnetic gradient field. In certain embodiments, a prospective phase encoding gradient update 404 can occur at a time after excitation and/or optional magnetic gradient field. In certain embodiments, a prospective phase encoding gradient update 404 can occur in connection with an additional radiofrequency pulse and/or optional magnetic gradient field. In certain embodiments, a prospective phase encoding gradient 404 can occur concurrently with and/or in conjunction with a data acquisition process 410.

In some embodiments, a prospective frequency encoding gradient update 406 can begin prior to and/or immediately prior to a data acquisition process 410. In certain embodiments, a prospective frequency encoding gradient update 406 can occur concurrently with and in conjunction with a data acquisition process 410. In certain embodiments, a prospective frequency encoding gradient update 406 can end immediately prior to the end of a data acquisition process 410.

An apply correction gradient block can comprise applying a brief additional gradient 408 to the subject to correct for a first gradient moment as discussed above. In certain embodiments the correction gradient 408 can be applied after excitation and/or optional magnetic gradient fields and any additional radiofrequency pulses and/or optional magnetic gradient fields. In certain embodiments, the correction gradient 408 can be applied to the subject immediately prior to data acquisition 410. In certain embodiments, the correction gradient 408 can be applied to the subject concurrently with any other magnetic field gradient.

Further, an apply phase correction block can comprise setting the phase of the MR detector or receiver, or the phase of the data acquisition 410 device to correct for zero-order phase errors 409 as determined by Equation 2. In certain embodiments, the phase correction block can be applied to the subject immediately prior to or concurrent with data acquisition 410.

In some embodiments an error correction block can comprise correcting any residual error 412 after data acquisition. In some embodiments, residual errors in one or more geometry parameters, phase, and/or gradient moments are corrected in the error correction block. Such errors can be present after applying or without applying one or more geometry updates, phase encoding updates, read encoding gradient updates, phase corrections and/or application of an additional correction gradient.

In certain embodiments, residual errors can remain after processing the magnetic resonance data, with or without the update geometry parameters block, update phase and/or read encoding gradients block, and/or apply correction gradient block. In certain embodiments the error correction 412 can occur after and/or immediately after data acquisition 410.

In some embodiments after the error correction block the system is configured to construct and/or reconstruct an image of the subject 414. In certain embodiments the system can be configured to reconstruct the image based on the magnetic resonance data as inputted into k-space. In some embodiments, the system is configured to reconstruct an image further based on prospectively updated slices, phase encoding gradient updates, frequency encoding gradient updates, application of a correction gradient, and/or error correction.

Update Geometry Parameters Block

In some embodiments, one or more geometry parameters are updated prospectively. For example, one or more geometry parameters can be updated after excitation but before data acquisition. By prospectively updating one or more geometric parameters rather than after data acquisition, data processing time can be saved and a more isotropic, rectangular coverage of k-space can be obtained. If the one or more geometric parameters are updated only retrospectively after data acquisition, certain areas in k-space can be denser than others, possibly resulting in image artifacts and/or more complex reconstruction. Further, if the one or more geometric parameters are updated only retrospectively after data acquisition, certain signals may be attenuated or lost, and cannot be recovered during image reconstruction.

Figure 5:
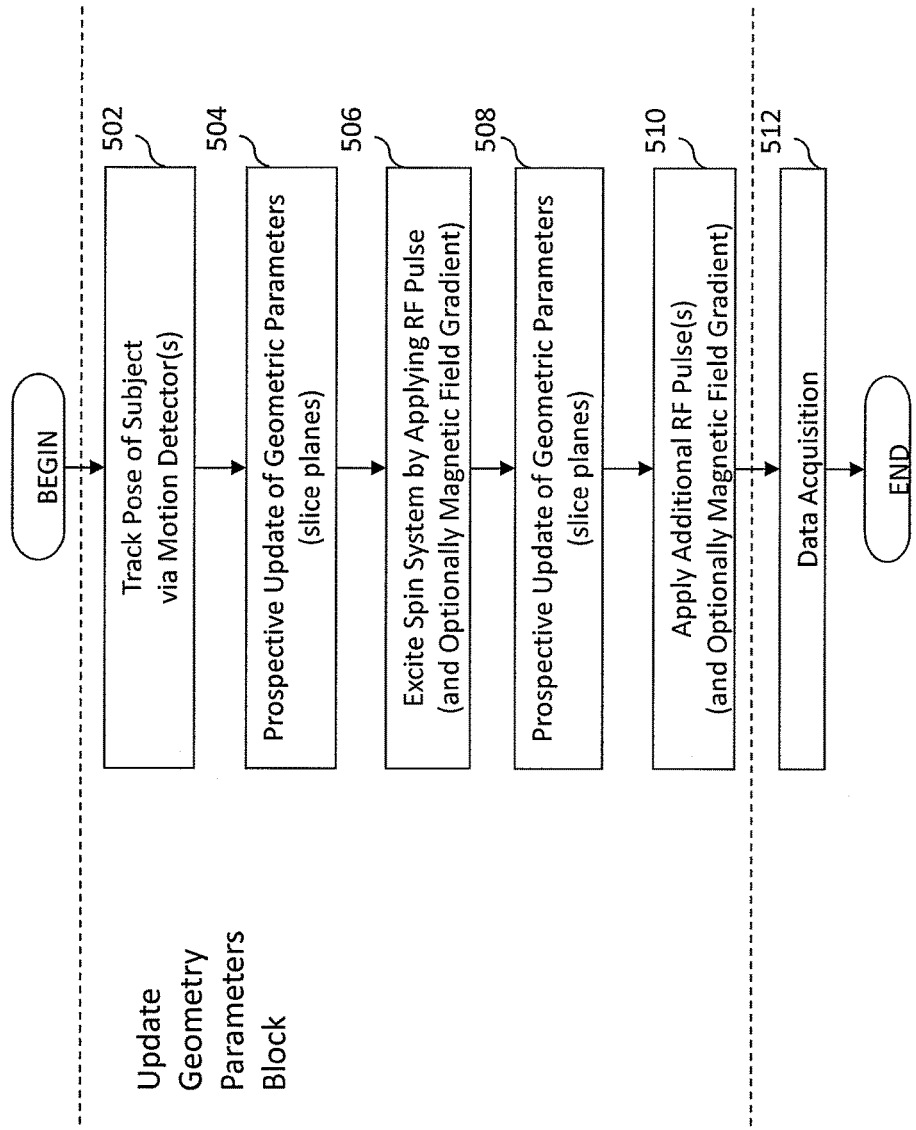
FIG. 5 is a process flow diagram illustrating an example of an embodiment of an update geometry parameters block of an embodiment of a method of intra-scan motion correction during a magnetic resonance scan.

FIG. 5 illustrates a process flow of an example of embodiments of one or more methods of intra-scan motion correction during a magnetic resonance scan. In some embodiments, the update geometry parameters block can be applied alone or in conjunction with one or more of an update phase and/or read encoding gradient(s) block, apply correction gradient block, apply correction phase block, and/or error correction block or sub-blocks thereof.

In some embodiments, the orientation and/or pose of a subject is tracked via one or more motion detectors at block 502. Based on the tracked orientation and/or pose of the subject the system can be configured to prospectively update one or more geometric parameters and/or slice planes at block 504. The one or more geometric parameters can comprise one or more parameters discussed above, including but not limited to translation and rotation. As discussed, the prospective update of geometric parameters and/or slice planes 504 can occur prior to and/or immediately prior to excitation of the spin system by applying an initial radiofrequency pulse at block 506. Further, the excitation can occur in conjunction with an optional magnetic field gradient at block 506.

Subsequent prospective updates of geometry parameters and/or slice planes can occur at block 508. As discussed, any of one or more, if any, subsequent prospective updates of geometric parameters and/or slice planes 508 can occur prior to and/or immediately prior to applying additional radiofrequency pulses at block 510. The radiofrequency pulses can be slice-selective refocusing, and/or slice-selective saturation and/or inversion pulses among others. The additional radiofrequency pulses can also be applied in conjunction with, before, and/or after applying an optional magnetic field gradient at block 510.

By updating the geometry parameters and/or slice planes immediately prior to all radiofrequency pulses, a line-by-line correction of motion between successive excitations is possible. In other words, signals throughout the entire measurement can be aligned in position.

In some embodiments, the system can be configured to conduct data acquisition at block 512 based on the scanned magnetic resonance data.

Update Phase and/or Read Encoding Gradient(s) Block

As discussed, motion of a subject during a magnetic resonance scan can also affect the orientation of phase/read encoding gradient, thereby resulting in motion artifacts. As such, in some embodiments, the orientations of phase and/or read encoding gradients are prospectively updated. By prospectively updating the orientation of phase and/or read encoding gradients rather than after data acquisition, data processing time can be saved and a more isotropic, rectangular grid in k-space can be obtained. In other words, a more homogeneous coverage in density in k-space is possible. If the phase and/or read encoding gradients are updated only retrospectively after data acquisition, certain areas in k-space can be denser than others, possibly resulting in more complex reconstruction and/or in image artifacts. Further, if the phase and/or read encoding gradients are updated only retrospectively after data acquisition, certain signals may be encoded incorrectly, and cannot be recovered during image reconstruction.

Figure 6:
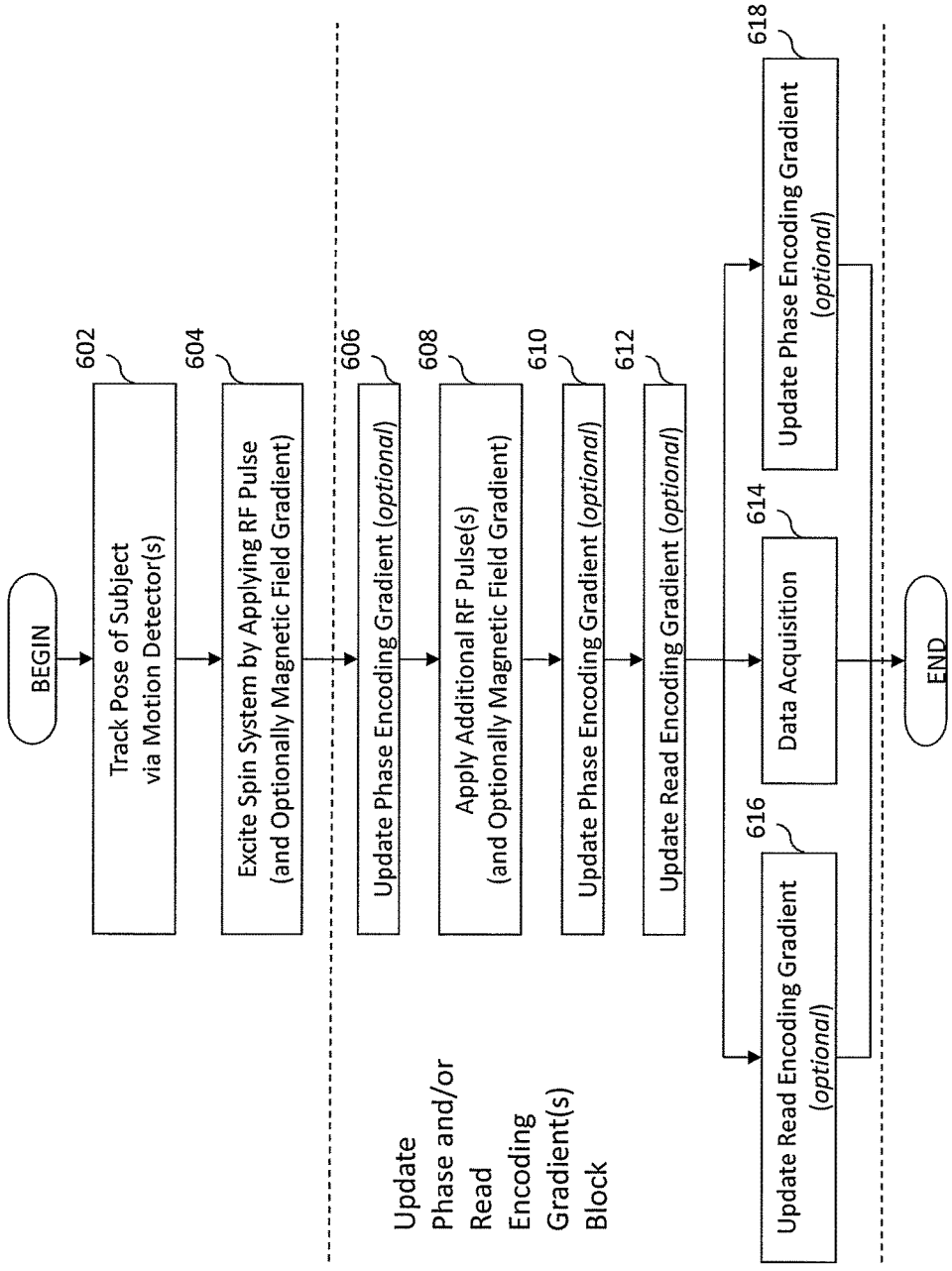
FIG. 6 is a process flow diagram illustrating an example of an embodiment of an update phase and/or read encoding gradient(s) block of an embodiment of a method of intra-scan motion correction during a magnetic resonance scan.

FIG. 6 illustrates an example of an embodiment of an update phase and/or read encoding gradient(s) block of an embodiment of a method of intra-scan motion correction during a magnetic resonance scan. In some embodiments, the update phase and/or read encoding gradient(s) block can be applied alone or in conjunction with one or more of an update geometry parameters block, apply correction gradient block, apply correction phase block, and/or error correction block or sub-blocks thereof.

In some embodiments, at block 602, one or more motion detectors are configured to track the orientation and/or pose of the subject during a magnetic resonance scan. In some embodiments, the system can further be configured to apply excitation of the spin system at block 604 by applying a radiofrequency pulse. In certain embodiments excitation of the spin system can occur in conjunction with, before, and/or after applying an optional magnetic field gradient at block 604.

As discussed, the orientation of a phase encoding gradient can be updated at any time after excitation and/or in conjunction with data acquisition 614. Prospectively updating the orientation of read encoding gradient and/or phase encoding gradient can occur at one or more of the blocks depicted in FIG. 6. Accordingly, in some embodiments, a phase encoding gradient can be prospectively updated at block 606 after excitation of the spin system at block 604. However, a prospective update of the phase encoding gradient need not occur at this time. Alternatively, a prospective update of the phase encoding gradient can occur at block 610 after applying one or more additional radiofrequency pulses at block 608. As discussed, any additional radiofrequency pulses can be applied at block 608 in conjunction with, before, and/or after applying an optional magnetic field gradient.

Further, a prospective update of the orientation of read encoding gradient can occur at block 612 immediately prior to data acquisition at block 614. In certain embodiments, the read encoding gradient can be updated at block 616 in conjunction with data acquisition at block 614. In certain embodiments, the read encoding gradient can be updated immediately prior to data acquisition 614 at block 612 and repeatedly in conjunction with data acquisition 614 at block 616. Also, the phase encoding gradient can also be updated in conjunction with data acquisition 614 at block 618.

Apply Correction Gradient Block

If a subject of a magnetic resonance scan remains completely still and does not move during the scan, the first gradient moment over the scan should ideally equal zero for a balanced magnetic resonance sequence. However, if a subject of a magnetic resonance scan moves even slightly, the first gradient moment after completion of the scan does not equal zero. The transverse magnetization generated by the excitation pulse is affected by motion that occurs in the presence of gradients. Such motion affects the phase of the magnetization and thus the first order gradient moment depending on the direction and velocity of motion, and the direction and sequence of the gradients applied.

As noted, motion affects the gradient moment/position of "lines" in k-space. If the movement is known or predicted, then the gradient moment effects can be calculated as per Equation 1. Gradient moment alterations can be compensated for by the application of additional brief gradient pulses prior to signal detection. Importantly, this type of motion compensation with correction gradients is applicable for rotations.

Of note, many preparation RF pulses act on longitudinal magnetization to modify the image contrast. Because longitudinal magnetization is not affected by gradients, it can be unnecessary to apply correction compensation gradients in this instance. In other words, simply correcting the geometry via one or more sub-blocks of the update geometry parameters block may be sufficient.

Figure 7:
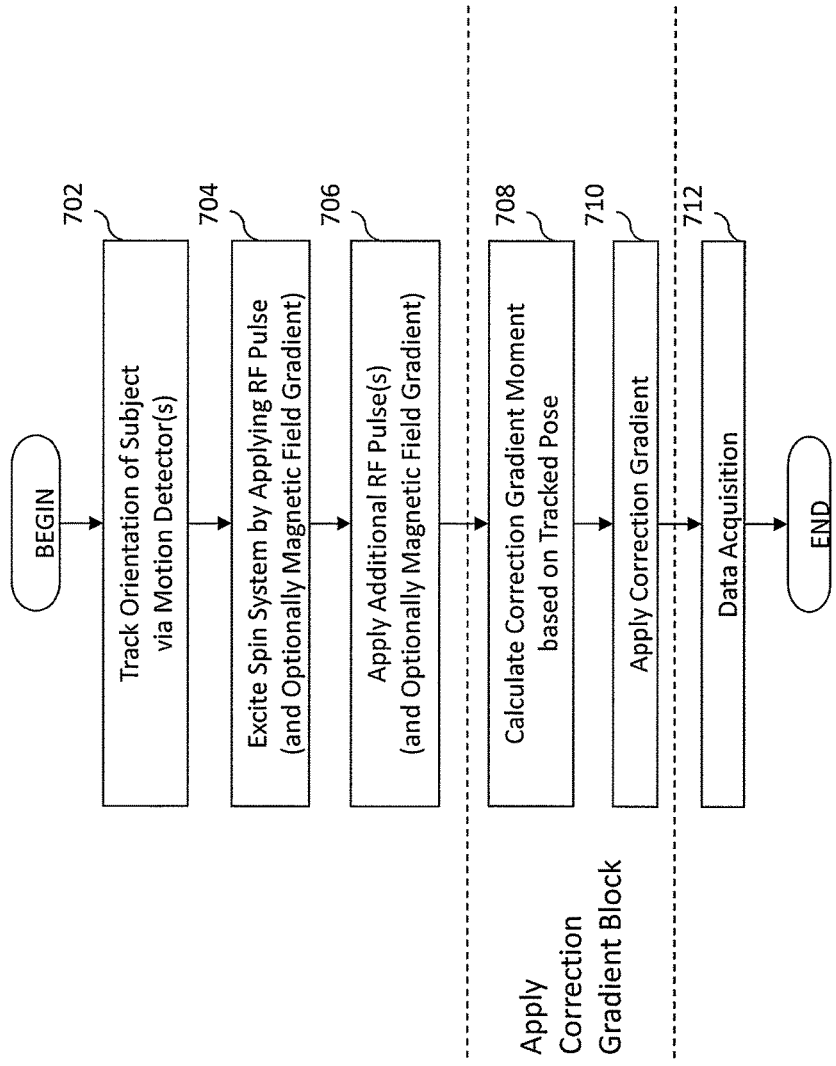
FIG. 7 is a process flow diagram illustrating an example of an embodiment of an apply correction gradient block of an embodiment of a method of intra-scan motion correction during a magnetic resonance scan.

FIG. 7 illustrates an example of an embodiment of an apply correction gradient block of an embodiment of a method of intra-scan motion correction during a magnetic resonance scan. In some embodiments, the apply correction gradient block can be applied alone or in conjunction with one or more of an update geometry parameters block, update phase and/or read encoding gradient(s) block, apply correction phase block, and/or error correction block or sub-blocks thereof.

As illustrated in FIG. 7, the system can be configured to track the orientation and/or pose of a subject during the scan via one or more motion detectors at block 702. In some embodiments, the spin system is excited by applying an initial radiofrequency pulse at block 704. Further, as discussed, in certain embodiments, the excitation can be applied in conjunction with one or more optional magnetic field gradients at block 704. In other embodiments, the system can be configured to apply additional magnetic field gradients. Such magnetic field gradients can comprise, for example, diffusion weighting gradients, flow encoding gradients, elasticity encoding gradients, gradients to eliminate unwanted spin coherences called spoiler or crusher gradients, gradients to prewind or rewind gradient moments, and/or other gradients. Additionally, one or more additional radiofrequency pulses can be applied to the subject at block 706. These one or more additional radiofrequency pulses can also be applied in conjunction with, before, and/or after applying one or more optional magnetic field gradients at block 706.

Apply Phase Correction Block

Further, if a subject of a magnetic resonance scan moves even slightly, the phase of the signal is altered. The transverse magnetization generated by the excitation pulse is affected by motion that occurs in the presence of gradients. Such motion affects the phase of the magnetization depending on the direction and velocity of motion, and the direction and sequence of the gradients applied.

Motion affects both the phase of the signals acquired, as well as the gradient moment/position of "lines" in k-space.

If the movement is known or predicted, then the phase effect can be calculated as per Equation 2. Phase alterations as per equation 2 may be compensated for by acquiring data at the correct reference-phase.

Figure 7A:
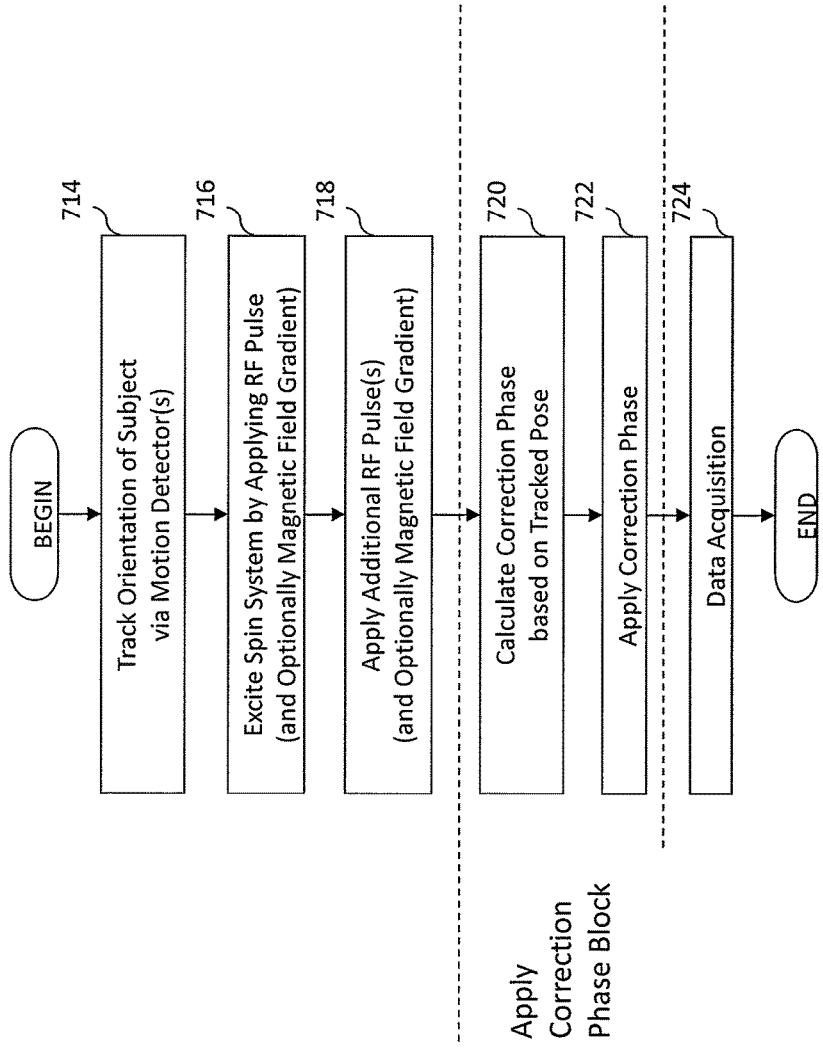
FIG. 7A is a process flow diagram illustrating an example of an embodiment of an apply correction phase block of an embodiment of a method of intra-scan motion correction during a magnetic resonance scan.

Accordingly, in some embodiments, a method of intra-scan motion correction comprises an apply correction phase block. FIG. 7A illustrates an example of an embodiment of an apply correction phase block of an embodiment of a method of intra-scan motion correction during a magnetic resonance scan. In some embodiments, the apply phase gradient block can be applied alone or in conjunction with one or more of an update geometry parameters block, update phase and/or read encoding gradient(s) block, apply gradient correction block, and/or error correction block or sub-blocks thereof.

In some embodiments the apply correction phase block can comprise calculating the correction phase at block 720. More specifically, Equation 2 and the tracked pose can be utilized to calculate the correction phase. The calculated correction phase can be applied to compensate for any or all phase effects at block 722. Further, the system can be configured to conduct data acquisition at block 724 after applying the correction gradient block in some embodiments.

Error Correction Block

In some situations, error can be present after data acquisition. For example, in some embodiments where the geometry, phase, and/or read encoding gradients are not updated prospectively or if a correction gradient is not applied, phase/gradient error and orientation error can be present in the data acquired. In certain embodiments, even after applying one or more of an update geometry parameters block, update phase and/or read encoding gradient(s) block, apply correction phase block, and/or apply correction gradient block, residual error in the phase/gradient and/or orientation can still be present. For example, the prospective update blocks are based on packets of orientation and/or pose data that are transmitted periodically from one or motion detectors to the computing system. However, there is an inherent lag time involved in the transmittal and processing of this data. Accordingly, one or more errors can still remain after prospective update blocks. As such, in some embodiments, an error correction block is applied to retrospectively correct for any remaining error.

Figure 8:
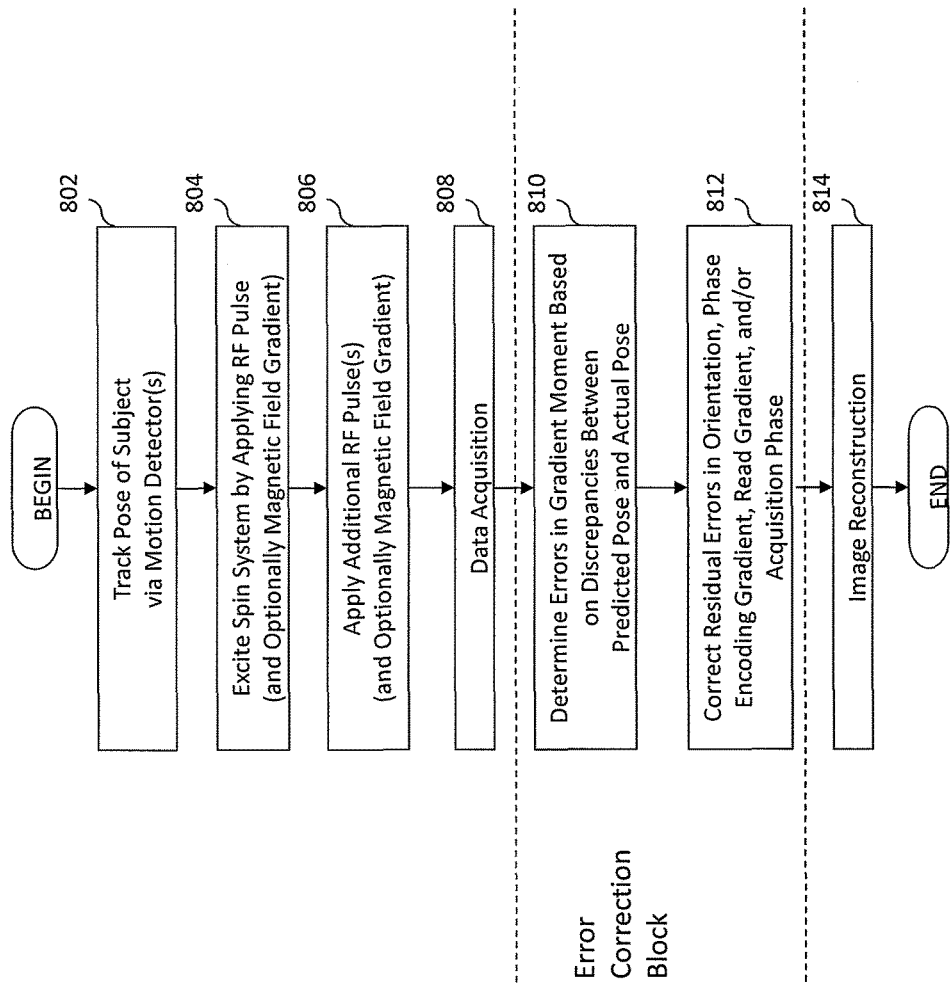
FIG. 8 is a process flow diagram illustrating an example of an embodiment of an error correction block of an embodiment of a method of intra-scan motion correction during a magnetic resonance scan.

FIG. 8 is a process flow diagram illustrating an error correction block. In some embodiments, the error correction block can be applied alone or in conjunction with one or more of an update geometry parameters block, update phase and/or read encoding gradient(s) block, apply correction phase block, and/or apply correction gradient block or sub-blocks thereof.

In some embodiments, a system can be configured to track the orientation and/or pose of a subject during a magnetic resonance imaging scan via one or more motion detectors at block 802. In certain embodiments, the spin system can be excited by applying an initial radiofrequency pulse at block 804. The excitation, in certain embodiments, can be applied in conjunction with applying an optional magnetic field gradient at block 804. In some embodiments the system can be configured to apply one or more additional radiofrequency pulses at block 806. The one or more additional radiofrequency pulses can also be applied in conjunction with, before, and/or after one or more magnetic field gradients. The magnetic resonance scan data can be collected at block 808 by the system in some embodiments.

Any residual errors that are present after data acquisition 808 can be determined by the system and/or corrected during an error correction block. For example, any residual errors in one or more geometry parameters and/or phase or gradient moment that are present after applying or without applying one or more geometry updates, phase encoding updates, read encoding gradient updates, and/or application of an additional correction gradient can be corrected.

In certain embodiment, the system can be configured to determine discrepancies between predicted motion, from the orientation and/or pose data that was collected and transmitted periodically to the system at block 802, and the actual motion data at block 810. The actual motion data, in certain embodiments, can only be determined after the data acquisition process is complete.

As discussed above, errors in the predicted motion from the orientation and/or pose data that is periodically detected and sent to the system at block 802 can comprise one or more errors due to the inherent lag time and/or noise. Because of such potential errors in the predicted motion data, there can also be some residual errors in orientation and/or pose or phase/gradient even after applying one or more of an update geometry parameters block, update phase and/or read encoding gradient(s) block, apply correction gradient block, apply correction phase block, and/or sub-blocks thereof. Such residual errors can be corrected during the error correction block based on the determined discrepancies between the predicted motion and actual motion.

Further, small errors in the orientation of phase and read-encoding gradients can also be corrected during reconstruction, for instance, by interpolating the originally acquired raw data to a rectilinear raw data grid prior to Fourier transformation.

In some embodiments, the system can be configured to reconstruct an image based on the magnetic resonance scan, orientation and/or pose update, phase encoding gradient update, read gradient update, application of correction gradient, apply correction phase block, and/or any errors corrected during the error correction block at block 814.

Motion Effects—Examples

Figure 9:
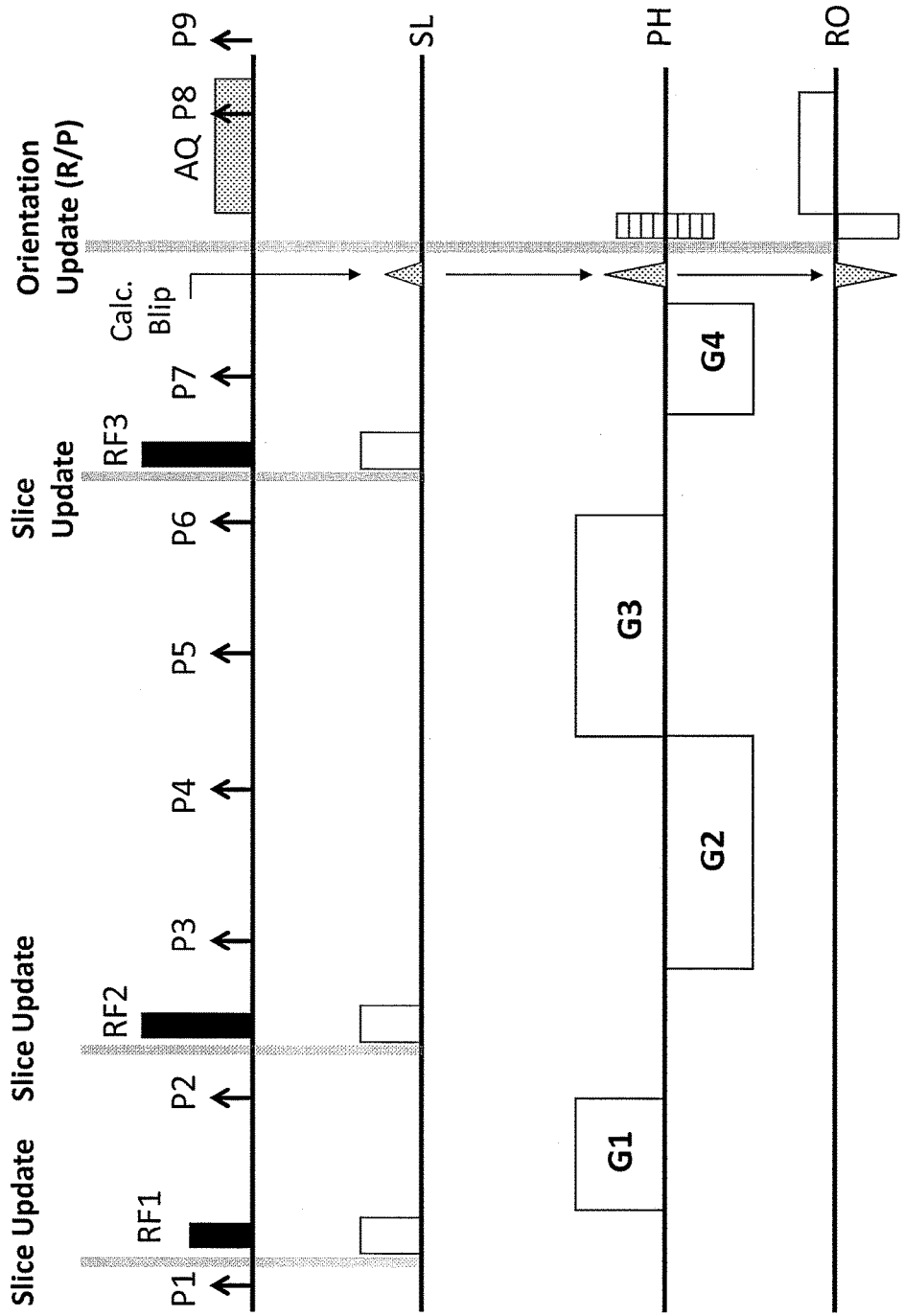
FIG. 9 is a schematic diagram illustrating the effects of an example of an embodiment of a method of intra-scan motion correction during a magnetic resonance scan.

FIG. 9 is a schematic diagram illustrating the effects of an embodiment of a method of intra-scan motion correction during a magnetic resonance scan. The illustrated embodiment in FIG. 9 comprises prospectively updating one or more geometry parameters, prospectively updating phase and/or read gradient(s), and applying a correction gradient.

As discussed above, in some embodiments, one or more slice updates or geometric updates are applied prior to and/or immediately prior to one or more radiofrequency pulses, including but not limited to excitation of the spin system. RF1 through RF3 correspond to one or more radiofrequency pulses. As illustrated, a slice update can occur immediately prior to application of radiofrequency pulse RF1. Further, another slice update can occur immediately prior to another radiofrequency pulse RF2. Additionally, another slice update can occur immediately prior to applying another radiofrequency pulse RF3.

P1 through P7 correspond to individual periodic packets of orientation and/or pose data that is detected by one or more motion detectors and transmitted to the magnetic resonance system in some embodiments. As illustrated, one or more slice updates can be applied by the system using the orientation and/or pose data packet that was transmitted to the system immediately prior to one or more slice updates and/or geometric updates. For example, a first slice update can be applied based on data packet P1. Further, another slice update can be applied based on the orientation and/or pose data packet P2. Additionally, another slice update can occur using the orientation and/or pose data packet P6.

In contrast to some embodiments where motion of a subject between excitation, for example RF1, and data acquisition, AQ, is ignored as negligible, the depicted embodiment prospectively updates geometric parameters within a single magnetic resonance scanning step to obtain clearer images. The second horizontal line denoted SL corresponds to slice gradients and updates. As illustrated in FIG. 9, the one or more slice updates are applied immediately prior to one or more radiofrequency pulses using an orientation and/or pose data packet that was received immediately prior to the slice update.

The third horizontal line denoted PH corresponds to phase encoding direction. As illustrated in FIG. 9, the phase encoding gradient in some embodiments is updated immediately prior to data acquisition, which is labeled AQ. In some embodiments, the data acquisition can last for anywhere from about one milliseconds to about 100 milliseconds or longer.

The fourth horizontal line denoted RO corresponds to the readout direction. As illustrated in FIG. 9, in some embodiments the read encoding update is applied immediately prior to or concurrently with data acquisition. In some embodiments, read encoding update is not required. Rather, only phase encoding update and/or geometry update is applied.

G1 through G4 in the PH horizontal line correspond to additional magnetic field gradients used to encode additional information, such as microscopic diffusion of molecules, or to eliminate unwanted signals, or for other purposes. As discussed above, if a subject does not move and remains completely still during a magnetic resonance scan, there is no gradient moment build-up. In other words, the sum of the areas of G1-G4 should equal zero. However, if the subject moves during a magnetic resonance scan, the interaction of gradients G1 through G4 with the moving subject causes the gradient moment build-up to not equal zero. This gradient moment build-up can cause additional motion artifacts in the scanned image.

Accordingly, in some embodiments, the system is configured to apply an additional brief gradient or a correction gradient to reverse the effects of the total gradient moment. In some embodiments, the correction gradient is simply the inverse of the gradient moment build-up. In the depicted embodiment, a "blip" or a correction gradient moment is calculated prior to or immediately prior to data acquisition. As illustrated, in order to calculate the gradient moment build-up, which is the integral of the gradient sequence multiplied by the rotation matrix during the scan, orientation and/or pose data packets from the entire scan duration can be used. For example, in the depicted embodiment, P1-P7 can be used in conjunction with the gradient sequence to calculate the gradient moment build-up.

However, as discussed, lag time and/or noise may be present in the orientation and/or pose data packets. For example, it requires time for data packet P5 to be transmitted from one or more motion detectors to the computer system and to be processed. As a result, such lag time and/or noise in orientation and/or pose data leads to possible errors in the prospective updates to one or more geometry parameters, phase/gradient, and/or calculation of a correction gradient.

However, after data acquisition, in some embodiments, the one or more motion detectors can be configured to continue to collect orientation and/or pose data, for example P8 and/or P9. With such continued data, the lag time can be accounted for. For example, each data packet can be shifted in time by a certain amount in order to account for the lag time. By shifting the time of orientation and/or pose data, the system can obtain true orientation and/or pose data and determine and/or correct any errors remaining after data acquisition.

Figure 10:
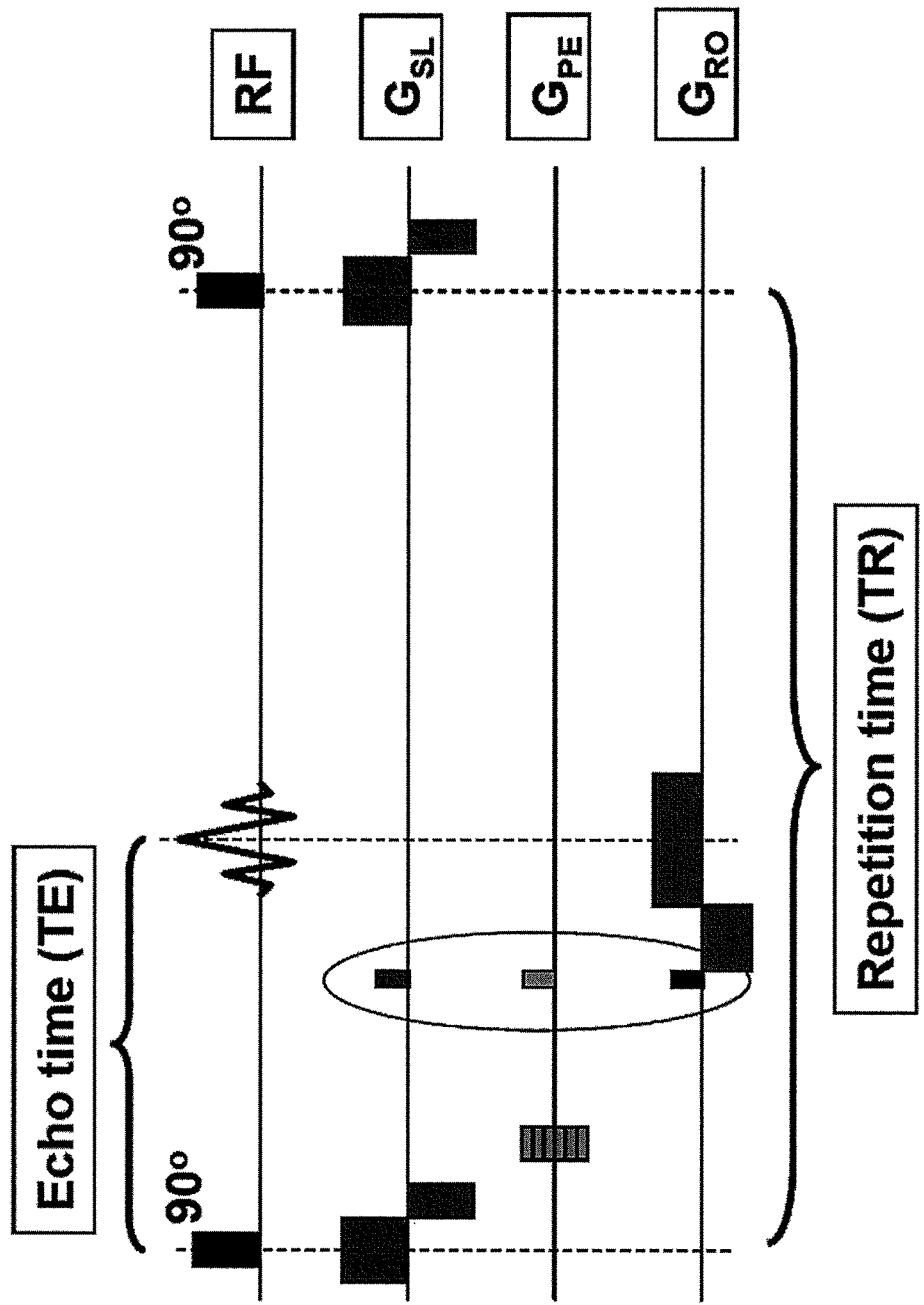
FIG. 10 is a schematic diagram illustrating the effects of an example of an embodiment of a method of intra-scan motion correction during a magnetic resonance scan.

FIG. 10 is another schematic diagram illustrating the effects of an embodiment of a method of intra-scan motion correction during a magnetic resonance scan. In FIG. 10, the first horizontal line RF illustrates the radiofrequency sequences. $G_{SL}$, $G_{PE}$, and $G_{RO}$ represent slice gradient, phase encoding gradient, and readout gradient respectively.

The echo time (TE) corresponds to the time between the center or excitation and the center of data acquisition. Similar to FIG. 9, a slice update is conducted by the system immediately prior to excitation. Further, a phase encoding gradient update is conducted by the system between excitation and data acquisition. Additionally, a correction gradient is applied by the system to the subject before data acquisition. The correction gradient in FIG. 10 is illustrated by the pulses located within the oval. Moreover, a read encoding gradient update can be conducted by the system in conjunction with data acquisition. For example, a read encoding gradient update process can begin immediately prior to data acquisition and continue to be conducted throughout the data acquisition process.

Further, in FIG. 10, another slice update is applied immediately before excitation of a second magnetic resonance scan. Repetition time (TR) refers to the time between the excitation of a first scan and a second scan.

As discussed, many embodiments of non-intrascan motion correction systems update scan parameters only once prior to each "excitation" radiofrequency (RF) pulse, which is typically every 100 ms or less frequently. Further, some of such embodiments only correct slice locations. Since the subject position and orientation is assumed to be static between a given "excitation" and "readout", such a scheme can work well for relatively slow movements, on the order of a few millimeters/second. However, more rapid movements require dynamic updates of sequence parameters (for instance every few milliseconds) between excitation and acquisition, i.e. within each line of k-space. Of note, some tracking techniques, such as optical techniques, can allow very rapid and accurate tracking, from 100 to up to 1000 times per second.

Consequently, updating scan parameters "intra-scan" as described herein can allow compensation of even the most rapid movements, up to 10 s or 100 s of mm/second or even higher. Therefore, rapidly repeated motion correction with "intra-scan" updates as described herein makes it possible to perform high-quality MR scans in very sick or confused subjects or children, without the need for anesthesia.

Importantly, the concepts described herein can generally be applied to any imaging or spectroscopy sequence and therefore can constitute a universal method to compensate the effects of subject motion in any MR scan. For some spectroscopy scans, data may not be acquired in k-space (i.e. without use of readout gradients); however, the methods disclosed can be used to eliminate phase errors and/or imbalances in gradient moments due to motion, which otherwise result in signal reduction and spectral distortions due to non coherent averaging of signals. Likewise, some imaging techniques use non-rectangular sampling in k-space, but the methods described can easily be adapted to such sampling schemes.

Computing System

Figure 11:
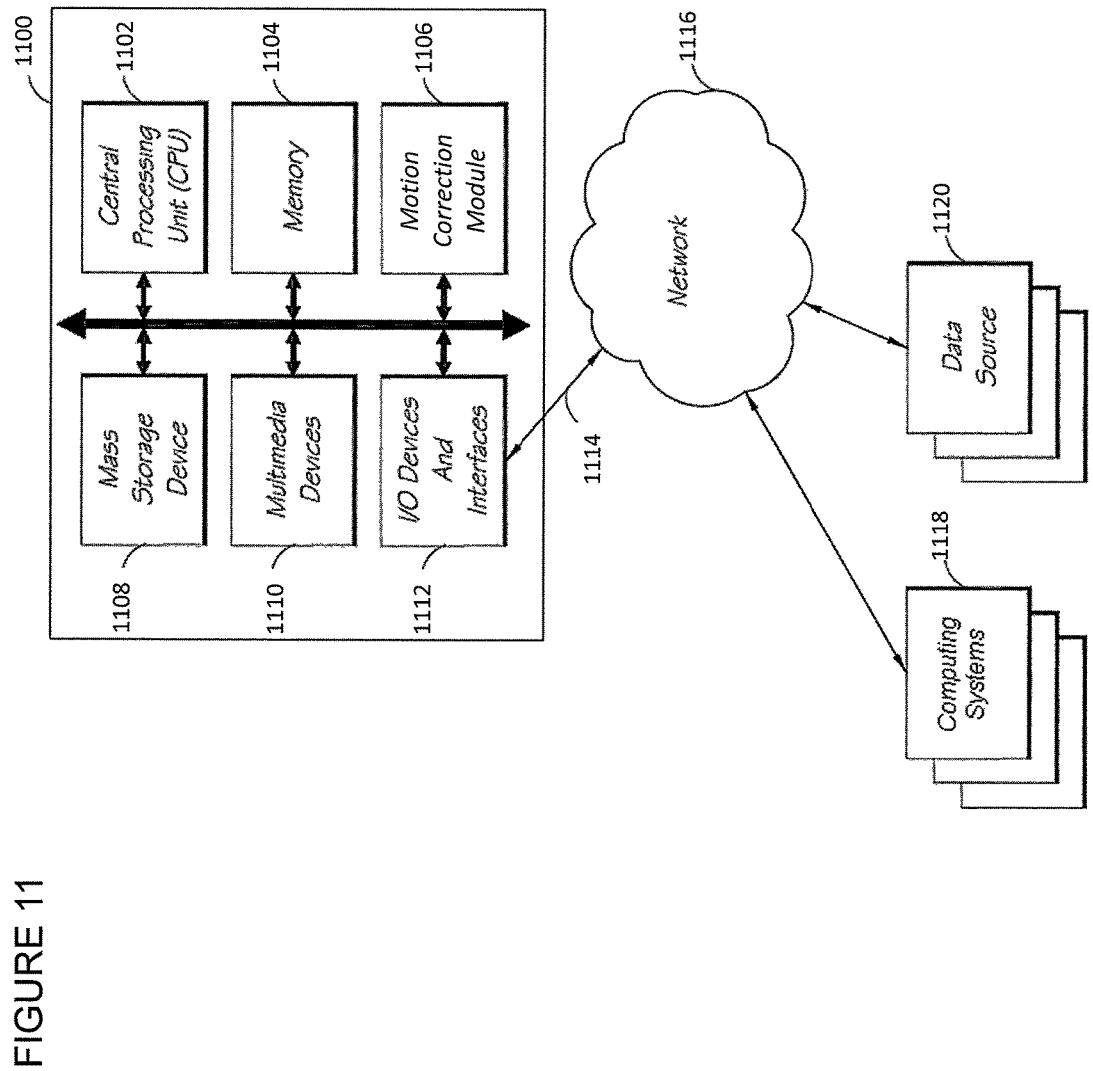
FIG. 11 is a block diagram depicting one embodiment of a computer hardware system configured to run software for implementing one or more embodiments of the continuous intra-scan motion correction systems described herein.

In some embodiments, the computer clients and/or servers described above take the form of a computing system 1100 illustrated in FIG. 11, which is a block diagram of one embodiment of a computing system that is in communication with one or more computing systems 1110 and/or one or more data sources 1120 via one or more networks 1116. The computing system 1100 may be used to implement one or more of the systems and methods described herein. In addition, in one embodiment, the computing system 1100 may be configured to apply one or more of the intra-scan motion correction techniques described herein. While FIG. 11 illustrates one embodiment of a computing system 1100, it is recognized that the functionality provided for in the components and modules of computing system 1100 may be combined into fewer components and modules or further separated into additional components and modules.

Motion Correction Module

In one embodiment, the system 1100 comprises a motion correction module 1106 that carries out the functions described herein with reference to repeatedly correcting motion effects during a scan, including any one of the intra-scan motion correction techniques described above. The motion correction module 1106 may be executed on the computing system 1100 by a central processing unit 1102 discussed further below.

In general, the word "module," as used herein, refers to logic embodied in hardware or firmware, or to a collection of software instructions, possibly having entry and exit points, written in a programming language, such as, for example, COBOL, CICS, Java, Lua, C or C++. A software module may be compiled and linked into an executable program, installed in a dynamic link library, or may be written in an interpreted programming language such as, for example, BASIC, Perl, or Python. It will be appreciated that software modules may be callable from other modules or from themselves, and/or may be invoked in response to detected events or interrupts. Software instructions may be embedded in firmware, such as an EPROM. It will be further appreciated that hardware modules may be comprised of connected logic units, such as gates and flip-flops, and/or may be comprised of programmable units, such as programmable gate arrays or processors. The modules described herein are preferably implemented as software modules, but may be represented in hardware or firmware. Generally, the modules described herein refer to logical modules that may be combined with other modules or divided into submodules despite their physical organization or storage.

Computing System Components

In one embodiment, the computing system 1100 also comprises a mainframe computer suitable for controlling and/or communicating with large databases, performing high volume transaction processing, and generating reports from large databases. The computing system 1100 also comprises a central processing unit ("CPU") 1102, which may comprise a conventional microprocessor. The computing system 1100 further comprises a memory 1104, such as random access memory ("RAM") for temporary storage of information and/or a read only memory ("ROM") for permanent storage of information, and a mass storage device 1108, such as a hard drive, diskette, or optical media storage device. Typically, the modules of the computing system 1100 are connected to the computer using a standards based bus system. In different embodiments, the standards based bus system could be Peripheral Component Interconnect (PCI), Microchannel, SCSI, Industrial Standard Architecture (ISA) and Extended ISA (EISA) architectures, for example.

The computing system 1100 comprises one or more commonly available input/output (I/O) devices and interfaces 1112, such as a keyboard, mouse, touchpad, and printer. In one embodiment, the I/O devices and interfaces 1112 comprise one or more display devices, such as a monitor, that allows the visual presentation of data to a user. More particularly, a display device provides for the presentation of GUIs, application software data, and multimedia presentations, for example. In the embodiment of FIG. 11, the I/O devices and interfaces 1112 also provide a communications interface to various external devices. The computing system 1100 may also comprise one or more multimedia devices 1110, such as speakers, video cards, graphics accelerators, and microphones, for example.

Computing System Device/Operating System

The computing system 1100 may run on a variety of computing devices, such as, for example, a server, a Windows server, an Structure Query Language server, a Unix server, a personal computer, a mainframe computer, a laptop computer, a cell phone, a personal digital assistant, a kiosk, an audio player, and so forth. The computing system 1100 is generally controlled and coordinated by operating system software, such as z/OS, Windows 95, Windows 98, Windows NT, Windows 2000, Windows XP, Windows Vista, Windows 7, Linux, BSD, SunOS, Solaris, or other compatible operating systems. In Macintosh systems, the operating system may be any available operating system, such as MAC OS X. In other embodiments, the computing system 5800 may be controlled by a proprietary operating system. Conventional operating systems control and schedule computer processes for execution, perform memory management, provide file system, networking, and I/O services, and provide a user interface, such as a graphical user interface ("GUI"), among other things.

Network

In the embodiment of FIG. 11, the computing system 1100 is coupled to a network 1116, such as a LAN, WAN, or the Internet, for example, via a wired, wireless, or combination of wired and wireless, communication link 1114. The network 1116 communicates with various computing devices and/or other electronic devices via wired or wireless communication links. In the embodiment of FIG. 11, the network 1116 is communicating with one or more computing systems 1118 and/or one or more data sources 1120.

Access to the image construction module 1106 of the computer system 1100 by computing systems 1118 and/or by data sources 1120 may be through a web-enabled user access point such as the computing systems' 1118 or data source's 1120 personal computer, cellular phone, laptop, or other device capable of connecting to the network 1116. Such a device may have a browser module is implemented as a module that uses text, graphics, audio, video, and other media to present data and to allow interaction with data via the network 1116.

The browser module may be implemented as a combination of an all points addressable display such as a cathode-ray tube (CRT), a liquid crystal display (LCD), a plasma display, or other types and/or combinations of displays. In addition, the browser module may be implemented to communicate with input devices 1112 and may also comprise software with the appropriate interfaces which allow a user to access data through the use of stylized screen elements such as, for example, menus, windows, dialog boxes, toolbars, and controls (for example, radio buttons, check boxes, sliding scales, and so forth). Furthermore, the browser module may communicate with a set of input and output devices to receive signals from the user.

The input device(s) may comprise a keyboard, roller ball, pen and stylus, mouse, trackball, voice recognition system, or pre-designated switches or buttons. The output device(s) may comprise a speaker, a display screen, a printer, or a voice synthesizer. In addition a touch screen may act as a hybrid input/output device. In another embodiment, a user may interact with the system more directly such as through a system terminal connected to the score generator without communications over the Internet, a WAN, or LAN, or similar network.

In some embodiments, the system 1100 may comprise a physical or logical connection established between a remote microprocessor and a mainframe host computer for the express purpose of uploading, downloading, or viewing interactive data and databases on-line in real time. The remote microprocessor may be operated by an entity operating the computer system 1100, including the client server systems or the main server system, an/or may be operated by one or more of the data sources 1120 and/or one or more of the computing systems. In some embodiments, terminal emulation software may be used on the microprocessor for participating in the micro-mainframe link.

In some embodiments, computing systems 1118 who are internal to an entity operating the computer system 1100 may access the image construction module 1106 internally as an application or process run by the CPU 1102.

User Access Point

In an embodiment, a user access point or user interface 1112 comprises a personal computer, a laptop computer, a cellular phone, a GPS system, a Blackberry® device, a portable computing device, a server, a computer workstation, a local area network of individual computers, an interactive kiosk, a personal digital assistant, an interactive wireless communications device, a handheld computer, an embedded computing device, or the like.

Other Systems

In addition to the systems that are illustrated in FIG. 11, the network 1116 may communicate with other data sources or other computing devices. The computing system 1100 may also comprise one or more internal and/or external data sources. In some embodiments, one or more of the data repositories and the data sources may be implemented using a relational database, such as DB2, Sybase, Oracle, CodeBase and Microsoft® SQL Server as well as other types of databases such as, for example, a signal database, object-oriented database, and/or a record-based database.

Conditional language, such as, among others, "can," "could," "might," or "may," unless specifically stated otherwise, or otherwise understood within the context as used, is generally intended to convey that certain embodiments include, while other embodiments do not include, certain features, elements and/or steps. Thus, such conditional language is not generally intended to imply that features, elements and/or steps are in any way required for one or more embodiments or that one or more embodiments necessarily include logic for deciding, with or without user input or prompting, whether these features, elements and/or steps are included or are to be performed in any particular embodiment. The headings used herein are for the convenience of the reader only and are not meant to limit the scope of the inventions or claims.

Although this invention has been disclosed in the context of certain preferred embodiments and examples, it will be understood by those skilled in the art that the present invention extends beyond the specifically disclosed embodiments to other alternative embodiments and/or uses of the invention and obvious modifications and equivalents thereof. Additionally, the skilled artisan will recognize that any of the above-described methods can be carried out using any appropriate apparatus. Further, the disclosure herein of any particular feature, aspect, method, property, characteristic, quality, attribute, element, or the like in connection with an embodiment can be used in all other embodiments set forth herein. For all of the embodiments described herein the steps of the methods need not be performed sequentially. Thus, it is intended that the scope of the present invention herein disclosed should not be limited by the particular disclosed embodiments described above.

What is claimed is:

1. A magnetic resonance system configured to correct intra-scan motion during a magnetic resonance scan, the system comprising:
    a magnetic resonance scanner configured to generate a magnetic field gradient and a radio frequency signal for the magnetic resonance scan;
    a motion tracking system configured to track one or more pose parameters of a subject and transmit pose data corresponding to the tracked one or more pose parameters at a given time to the magnetic resonance scanner;
    an electronic memory storage configured to store modules; and
    a computer processor configured to execute the modules comprising at least:
        a correction gradient calculation module configured to calculate a moment of a correction gradient configured to be applied to the subject after application of all of a plurality of RF pulses of a pulse sequence to the subject during the magnetic resonance scan but prior to detecting signals emitted from the subject in response to the application of all of the plurality of RF pulses and the correction gradient, wherein the moment of the correction gradient is calculated based on an integral of the transmitted pose data and the pulse sequence;
        the magnetic resonance scanner further configured to generate the correction gradient based on the calculated moment and apply the correction gradient to the subject after the application of all of the plurality of RF pulses to the subject but prior to detecting the signals emitted from the subject in response to the application of all of the plurality of RF pulses and the correction gradient to prospectively correct one or more errors in magnetic gradient moment due to rotational movement of the subject during the magnetic resonance scan; and
        the magnetic resonance scanner further configured to detect the signals emitted from the subject for data acquisition.

2. The magnetic resonance system of claim 1, wherein the moment of the correction gradient is calculated to reverse a first gradient moment, wherein the first gradient moment is calculated from the transmitted pose data according to:

$$M = \int_0^T R^{-1}(t) \cdot G(t) \cdot dt$$

wherein R(t) is a rotation matrix of the subject, G(t) is a time series of gradients, and T is acquisition time.

3. The magnetic resonance system of claim 1, wherein the correction gradient is an additional magnetic gradient to be applied to the subject for a period of time.

4. The magnetic resonance system of claim 1, wherein the correction gradient is applied in conjunction with another gradient.

5. The magnetic resonance system of claim 1, wherein the correction gradient is further configured to be applied to the subject immediately prior to detecting signals emitted from the subject for data acquisition.

6. The magnetic resonance system of claim 1, further comprising an error correction module configured to compare the transmitted pose data to final pose data and eliminate one or more residual errors in the calculation of the moment of the correction gradient, wherein the final pose data is available after data acquisition.

7. The magnetic resonance system of claim 1, further comprising a phase encoding update module configured to update one or more phase encoding gradients based on the transmitted pose data.

8. The magnetic resonance system of claim 7, further comprising an error correction module configured to compare the transmitted pose data to final pose data and eliminate one or more residual errors in the updates to the one or more phase encoding gradients, wherein the final pose data is available after data acquisition.

9. The magnetic resonance system of claim 7, wherein the phase encoding update module is configured to update the one or more phase encoding gradients after application of an RF pulse of the plurality of RF pulses and prior to data acquisition by the magnetic resonance scanner.

10. The magnetic resonance system of claim 7, wherein the phase encoding update module is configured to update the one or more phase encoding gradients concurrently with data acquisition by the magnetic resonance scanner.

11. The magnetic resonance system of claim 1, further comprising a read encoding gradient update module configured to update one or more read encoding gradients based on the transmitted pose data.

12. The magnetic resonance system of claim 11, further comprising an error correction module configured to compare the transmitted pose data to final pose data and eliminate one or more residual errors in the updates to the one or more read encoding gradients, wherein the final pose data is available after data acquisition.

13. The magnetic resonance system of claim 11, wherein the read encoding update module is configured to update the one or more read encoding gradients after application of an RF pulse of the plurality of RF pulses and prior to data acquisition by the magnetic resonance scanner.

14. The magnetic resonance system of claim 11, wherein the read encoding gradient update module is configured to update the one or more read encoding gradients concurrently with data acquisition by the magnetic resonance scanner.

15. The magnetic resonance system of claim 1, further comprising a phase correction module configured to correct errors in one or more phases.

16. The magnetic resonance system of claim 15, wherein the phase correction module is configured to correct errors in the one or more phases based on:

$$\varphi = 2\pi\gamma \int_0^T X(t) \cdot G(t) \cdot dt$$

wherein X(t) is a translation matrix of the subject, G(t) is a time series of gradients, and T is acquisition time.

17. The magnetic resonance system of claim 1, wherein the one or more of transmitted pose data used to calculate the moment of the correction gradient is shifted in time to correct for one or more prediction errors related to the transmitted pose data.

18. The magnetic resonance system of claim 17, wherein the one or more prediction errors comprise lag time, noise, and changes in motion pattern.

19. The magnetic resonance system of claim 1, wherein the motion tracking system comprises a Moire Phase Tracking system.

20. The magnetic resonance system of claim 1, wherein the motion tracking system comprises a stereovision tracking system.

21. The magnetic resonance system of claim 1, wherein the system is capable of correcting one or more errors due to movement of the subject occurring at greater than 10 mm per second.

* * * * *